US009105789B2

(12) United States Patent
Mazzillo et al.

(10) Patent No.: US 9,105,789 B2
(45) Date of Patent: Aug. 11, 2015

(54) GEIGER-MODE AVALANCHE PHOTODIODE WITH HIGH SIGNAL-TO-NOISE RATIO, AND CORRESPONDING MANUFACTURING PROCESS

(75) Inventors: Massimo Cataldo Mazzillo, Corato (IT); Delfo Nunziato Sanfilippo, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/070,876

(22) Filed: Mar. 24, 2011

(65) Prior Publication Data

US 2011/0241149 A1 Oct. 6, 2011

(30) Foreign Application Priority Data

Mar. 30, 2010 (IT) .............................. TO2010A0251

(51) Int. Cl.
*H01L 31/107* (2006.01)

(52) U.S. Cl.
CPC .................................... *H01L 31/107* (2013.01)

(58) Field of Classification Search
CPC .............................. H01L 31/107; H01L 31/18
USPC .................... 257/438, E31.063, 465; 438/91; 250/214.1, 214 R, 208.1
See application file for complete search history.

(56) References Cited

U.S. PATENT DOCUMENTS 4,313,127 A 1/1982 Su et al.
4,972,244 A 11/1990 Buffet et al.
5,360,987 A 11/1994 Shibib (Continued)

FOREIGN PATENT DOCUMENTS

DE 102007037020 8/2008
EP 1596439 11/2005

(Continued)

OTHER PUBLICATIONS

A. Campisia, L. Cosentino, P. Finocchiaro, A. Pappalardo, F. Musumeci, S. Privitera, A. Scordino, S. Tudisco, G. Fallica, D. Sanfilippo, M. Mazzillo, G. Condorelli, A. Piazza, G. Valvo, S. Lombardo, E. Sciacca, G. Bonanno, M. Belluso, "Multipixel geiger-mode photon detectors for ultra-weak light sources", Nuclear Instruments and Methods in Physics Research A 571 (2007), pp. 350-354.
Massimo Mazzillo, Alessandro Piazza, Giovanni Condorelli, Delfo Sanfilippo, Giorgio Fallica, Sergio Billotta, Massimiliano Belluso, Giovanni Bonanno, Luigi Cosentino, Alfio Pappalardo, and Paolo Finocchiaro, "Quantum Detection Efficiency in Geiger Mode Avalanche Photodiodes", IEEE Transactions on Nuclear Science, vol. 55, No. 6, Dec. 2008, pp. 3620-3625.
F. Zappa, S. Tisa , A. Tosi, S. Cova, "Principles and features of single-photon avalanche diode arrays", Sensors and Actuators A 140 (2007), pp. 103-112.

(Continued)

*Primary Examiner* — Christine Enad
(74) *Attorney, Agent, or Firm* — Allen, Dyer, Doppelt, Milbrath & Gilchrist, P.A.

(57) ABSTRACT

An embodiment of a geiger-mode avalanche photodiode includes: a body of semiconductor material, having a first surface and a second surface; a cathode region of a first type of conductivity, which extends within the body; and an anode region of a second type of conductivity, which extends within the cathode region and faces the first surface, the anode and cathode regions defining a junction. The anode region includes at least two subregions, which extend at a distance apart within the cathode region starting from the first surface, and delimit at least one gap housing a portion of the cathode region, the maximum width of the gap and the levels of doping of the two subregions and of the cathode region being such that, by biasing the junction at a breakdown voltage, a first depleted region occupies completely the portion of the cathode region within the gap.

30 Claims, 14 Drawing Sheets

(56) References Cited

U.S. PATENT DOCUMENTS

| | | | | |
|---|---|---|---|---|
| 5,367,188 | A * | 11/1994 | Kudo | 257/461 |
| 5,501,893 | A | 3/1996 | Laermer et al. | |
| 5,596,186 | A | 1/1997 | Kobayashi | |
| 6,118,142 | A | 9/2000 | Chen et al. | |
| 6,307,244 | B1 * | 10/2001 | Shikata | 257/471 |
| 6,437,415 | B1 | 8/2002 | Kuhara et al. | |
| 6,541,836 | B2 | 4/2003 | Iwanczyk et al. | |
| 6,551,904 | B2 * | 4/2003 | Kawahara | 438/435 |
| 6,693,337 | B2 | 2/2004 | Yoneda et al. | |
| 6,949,445 | B2 | 9/2005 | Rhodes et al. | |
| 6,979,874 | B2 | 12/2005 | Harada | |
| 6,995,444 | B2 * | 2/2006 | Cova et al. | 257/438 |
| 8,471,293 | B2 | 6/2013 | Sanfilippo et al. | |
| 8,476,730 | B2 | 7/2013 | Sanfilippo et al. | |
| 8,766,164 | B2 | 7/2014 | Sanfilippo et al. | |
| 8,778,721 | B2 | 7/2014 | Sanfilippo et al. | |
| 2001/0017786 | A1 | 8/2001 | Woodward | |
| 2002/0139970 | A1 | 10/2002 | Iwanczyk et al. | |
| 2007/0020791 | A1 | 1/2007 | Hsu et al. | |
| 2007/0045767 | A1 | 3/2007 | Zhu et al. | |
| 2008/0121988 | A1 | 5/2008 | Mallikararjunaswamy et al. | |
| 2008/0157150 | A1 | 7/2008 | Shim | |
| 2008/0191238 | A1 | 8/2008 | Madathil et al. | |
| 2008/0194052 | A1 * | 8/2008 | Iwai | 438/42 |
| 2008/0308738 | A1 | 12/2008 | Li et al. | |
| 2008/0315248 | A1 | 12/2008 | Tokura et al. | |
| 2009/0032896 | A1 * | 2/2009 | Taniguchi et al. | 257/462 |
| 2009/0057757 | A1 | 3/2009 | Hokomoto et al. | |
| 2009/0065826 | A1 | 3/2009 | Hwang | |
| 2009/0184317 | A1 | 7/2009 | Sanfilippo et al. | |
| 2009/0184384 | A1 * | 7/2009 | Sanfilippo et al. | 257/432 |
| 2010/0127314 | A1 | 5/2010 | Frach | |
| 2010/0148040 | A1 | 6/2010 | Sanfilippo et al. | |
| 2010/0271108 | A1 * | 10/2010 | Sanfilippo et al. | 327/502 |
| 2011/0095388 | A1 * | 4/2011 | Richter et al. | 257/432 |

FOREIGN PATENT DOCUMENTS

| | | | |
|---|---|---|---|
| EP | 1744366 | | 1/2007 |
| EP | 1755171 | | 2/2007 |
| RU | 2102821 | | 1/1998 |
| WO | 2007108456 | A1 | 9/2007 |
| WO | 2008129433 | | 10/2008 |

OTHER PUBLICATIONS

M. Mazzillo, G. Condorelli, A. Campisi, E. Sciacca, M. Belluso, S. Billotta, D. Sanfilippo, G. Fallica, L. Cosentino, P. Finocchiaro, F. Musumeci, S. Privitera, S. Tudisco, S. Lombardo, E. Rimini, G. Bonanno, "Single photon avalanche photodiodes arrays", Sensors and Actuators A 138 (2007), pp. 306-312.

E. Sciacca, S. Lombardo, M. Mazzillo, G. Condorelli, D. Sanfilippo, A. Contissa, M. Belluso, F. Torrisi, S. Billotta, A. Campisi, L. Cosentino, A. Piazza, G. Fallica, P. Finocchiaro, F. Musumeci, S. Privitera, S. Tudisco, G. Bonanno, and E. Rimini, "Arrays of Geiger Mode Avalanche Photodiodes", IEEE Photonics Technology Letters, vol. 18, No. 15, Aug. 1, 2006, pp. 1633-1635.

Brian F. Aull, Andrew H. Loomis, Douglas J. Young, Richard M. Heinrichs, Bradley J. Felton, Peter J. Daniels, and Deborah J. Landers, "Geiger-Mode Avalanche Photodiodes for Three-Dimensional Imaging", Lincoln Laboratory Journal, vol. 13, No. 2, 2002, pp. 335-350.

Cristiano Niclass, Alexis Rochas, Pierre-André Besse, and Edoardo Charbon, "Design and Characterization of a CMOS 3-D Image Sensor Based on Single Photon Avalanche Diodes", IEEE Journal of Solid-State Circuits, vol. 40, No. 9, Sep. 2005, pp. 1847-1854.

Emilio Sciacca, Andrea C. Giudice, Delfo Sanfilippo, Franco Zappa, Salvatore Lombardo, Rosario Consentino, Cinzia Di Franco, Massimo Ghioni, Giorgio Fallica, Giovanni Bonanno, Sergio Cova, and Emanuele Rimini, "Silicon Planar Technology for Single-Photon Optical Detectors", IEEE Transactions on Electron Devices, vol. 50, No. 4, Apr. 2003, pp. 918-925.

K. Shimakura, T. Suzuki and Y. Yadoiwa, "Boron and Phosphorus Diffusion Through an SiO2, Layer From a Doped Polycrystalline Si Source Under Various Drive-In Ambients", Solid-State Electronics, 1975, vol. 18, pp. 991-997.

Search Report for Italian Application No. TO20100251, Ministero dello Sviluppo Economico, Nov. 12, 2010, pp. 3.

Italian Search Report for Application No. ITTO20090322, Ministero dello Sviluppo Economico, Nov. 6, 2009, pp. 2.

Search Report based on Italian Patent Application Serial No. TO20080945, Ministero dello Sviluppo Economico, Munich, Nov. 4, 2009, pp. 2.

S. Cova, M. Ghioni, A. Lacaita, C. Samori, and F. Zappa, "Avalanche photodiodes and quenching circuits for single-photon detection", Applied Optics, vol. 35, No. 12, Apr. 20, 1996, pp. 1956-1976.

B. Dolgosheina, V. Balagurab, P. Buzhana, M. Danilovb, L. Filatovd, E. Garuttic, M. Grolle, A. Ilyina, V. Kantserova, V. Kaplina, A. Karakasha, F. Kayumova, S. Klemind, V. Korbelc, H. Meyerc, R. Mizukb, V. Morgunovb, E. Novikovb, P. Pakhlovb, E. Popovaa, V. Rusinovb, F. Sefkowc, E. Tarkovskyb, I. Tikhomirovb, Calice/SiPM Collaboration, "Status report on silicon photomultiplier development and its applications", Nuclear Instruments and Methods in Physics Research A 563 (2006), pp. 368-376.

Claudio Piemonte, "A new Silicon Photomultiplier structure for blue light detection", Nuclear Instruments and Methods in Physics Research A 568 (2006), pp. 224-232.

Z. Sadygova, A. Olshevskia, I. Chirikova, I. Zheleznykhc, A. Novikov, "Three advanced designs of micro-pixel avalanche photodiodes: Their present status, maximum possibilities and limitations", Nuclear Instruments and Methods in Physics Research A 567 (2006), pp. 70-73.

W.J. Kindt, N.H. Shahrjerdy, H.W. van Zeijl, "A silicon avalanche photodiode for single optical photon counting in the Geiger mode", Sensor and Actuators A 60 (1997), pp. 98-102.

D. Renker, "Geinger-mode avalanche photodiodes, history, properties and problems", Nuclear Instruments and Methods in Physics Research A 567 (2006), pp. 48-56.

P. Buzhana, B. Dolgosheina, L. Filatovb, A. Ilyina, V. Kantzerova, V. Kaplina, A. Karakasha, F. Kayumovc, S. Kleminb, E. Popovaa, S. Smirnov, "Silicon photomultiplier and its possible applications", Nuclear Instruments and Methods in Physics Research A 504 (2003) 48-52.

Massimo Ghioni, Angelo Gulinatti, Ivan Rech, Franco Zappa, and Sergio Cova, "Progress in Silicon Single-Photon Avalanche Diodes", IEEE Journal of Selected Topics in Quantum Electronics, vol. 13, No. 4, Jul./Aug. 2007, pp. 852-862.

J. C. Jackson, D. Phelan, A. P. Morrison, R. M. Redfern and A. Mathewson, "Towards integrated single photon counting microarrays", Optical Engineering, vol. 42, No. 1, Jan. 2003, pp. 112-118.

Franco Zappa, Angelo Gulinatti, Piera Maccagnani, Simone Tisa, and Sergio Cova, "SPADA: Single-Photon Avalanche Diode Arrays", IEEE Photonics Technology Letters, vol. 17, No. 3, Mar. 2005, pp. 657-659.

Dieter Renker, "Properties of avalanche photodiodes for applications in high energy physics, astrophysics and medical imaging", Nuclear Instruments and Methods in Physics Research A 486 (2002), pp. 164-169.

S. Vasile, P. Gothoskar, R. Farrell and D. Sdrulla, "Photon Detection with High Avalanche Photodiode Arrays", IEEE Transactions on Nuclear Science, vol. 45, No. 3, Jun. 1998, pp. 720-723.

Ghioni et al., "Progress in Silicon Single-Photon Avalanche Diodes," IEEE Journal of Selected Topics in Quantum Electronics, vol. 13, No. 4, Jul./Aug. 2007, pp. 852-862.

Mazzillo et al., "Quantum Detection Efficiency in Geiger Mode Avalanche Photodiodes," IEEE Transactions on Nuclear Science, vol. 55, No. 6, Dec. 2008, pp. 3620-3625.

Mazzillo et al., "Silicon Photomultiplier Technology at STMicroelectronics," IEEE Transactions on Nuclear Science, vol. 56, No. 4, Aug. 2009, pp. 2434-2442.

* cited by examiner

GEIGER-MODE AVALANCHE PHOTODIODE WITH HIGH SIGNAL-TO-NOISE RATIO, AND CORRESPONDING MANUFACTURING PROCESS

PRIORITY CLAIM

The instant application claims priority to Italian Patent Application No. TO2010A000251, filed Mar. 30, 2010, which application is incorporated herein by reference in its entirety.

RELATED APPLICATION DATA

This application is related to U.S. patent application Ser. No. 12/356,445, entitled ARRAY OF MUTUALLY ISOLATED, GEIGER-MODE, AVALANCHE PHOTODIODES AND MANUFACTURING METHOD THEREOF filed Jan. 20, 2009; U.S. patent application Ser. No. 12/356,464, entitled ARRAY OF MUTUALLY INSULATED GEIGER-MODE AVALANCHE PHOTODIODES, AND CORRESPONDING MANUFACTURING PROCESS filed Jan. 20, 2009; U.S. patent application Ser. No. 12/637,628, entitled GEIGER-MODE PHOTODIODE WITH INTEGRATED AND ADJUSTABLE QUENCHING RESISTOR, PHOTODIODE ARRAY, AND MANUFACTURING METHOD THEREOF filed Dec. 14, 2009; and U.S. patent application Ser. No. 12/764,888, entitled GEIGER-MODE PHOTODIODE WITH INTEGRATED AND JFET-EFFECT-ADJUSTABLE QUENCHING RESISTOR, PHOTODIODE ARRAY, AND CORRESPONDING MANUFACTURING METHOD filed Apr. 21, 2010; all of the foregoing applications are incorporated herein by reference in their entireties.

TECHNICAL FIELD

An embodiment relates to a geiger-mode avalanche photodiode with a high signal-to-noise ratio and to a corresponding manufacturing process.

BACKGROUND

As is known, in the technical field of photon detection, the need is felt to have devices that enable detection of electromagnetic radiation with a high sensitivity, and hence that enable detection of even a limited number, of photons associated with the electromagnetic radiation itself.

For this purpose, the so-called "geiger-mode avalanche photodiodes" (GM-APDs) are known, which theoretically enable detection of individual photons.

A geiger-mode avalanche photodiode, also known as single-photon avalanche diode (SPAD), is formed by an avalanche photodiode (APD), and hence comprises a junction made of semiconductor material, which has a breakdown voltage $V_B$ and is biased, in use, with a reverse-biasing voltage $V_A$ higher in absolute value than the breakdown voltage $V_B$ of the junction (which, as is known, depends upon the semiconductor material and upon the level of doping of the least doped region of the junction itself), typically higher than 10-20%. In this way, the junction has a particularly extensive depleted region, present in which is a non-negligible electrical field. Hence, the generation of a single electron-hole pair, caused by absorption within the depleted region of a photon incident on the SPAD within the depleted region, may be sufficient to trigger an ionization process. The ionization process in turn causes an avalanche multiplication of the carriers, with gains in the region of $10^6$, and consequent generation in short times (hundreds of picoseconds) of the so-called avalanche current, or more precisely of a pulse of the avalanche current.

The avalanche current may be appropriately collected, typically by means of external circuitry coupled to the junction, for example by appropriate anode and cathode contacts, and represents an output signal of the SPAD, also referred to as "output current". In practice, in principle, for each photon absorbed, a pulse of the output current of the SPAD is generated.

It is noted that, strictly speaking, present across the junction is an effective voltage $V_e$, which coincides with the reverse-biasing voltage $V_A$ only in the absence of photons. In fact, in the presence of photons, and hence of current generated within the SPAD, the effective voltage $V_e$ across the junction is less, in absolute value, than the reverse-biasing voltage $V_A$. However, in the present document it is assumed, except where otherwise explicitly stated, that the effective voltage $V_e$ across the junction coincides with the reverse-biasing voltage $V_A$.

It is likewise noted that, upon generation of the output current, or rather of corresponding pulses of the output current, there may concur not only both of the carriers of each electron-hole pair that has been generated following absorption of a photon within the depleted region, but also, given the reverse biasing of the junction, the minority carriers of the electron-hole pairs that have been generated following absorption of a photon outside the depleted region, hence in a quasi-neutral region, i.e., with a substantially zero electrical field. For example, assuming a junction of a PN type with the P region set, with respect to the direction of propagation of the photons, upstream of the N region, both the electrons of the electron-hole pairs generated in the non-depleted portion of the P region of the junction (also known as "dead layer") and the holes of the electron-hole pairs generated in the non-depleted portion of the N region of the junction (generally known as "epilayer") may contribute to the output current.

In particular, the aforementioned minority carriers may cause generation of corresponding output current pulses in the case where they manage to diffuse as far as the depleted region before recombining.

However, even though they may also contribute to photon detection, the minority carriers of the electron-hole pairs that have been generated outside the depleted region typically require, in order to be able to reach the depleted region, diffusion times ranging (according to the generation point and the level of doping) between hundreds of picoseconds and tens of nanoseconds; therefore, they may hence be collected at the anode and cathode terminals with considerable delays. In this way, a deterioration of the performance of the SPADs may occur, in terms of rapidity in generation of an output current pulse following absorption of a photon, i.e., in terms of the so-called response time (timing) of the SPAD. In particular, the generation, in the output current, of so-called "diffusion tails" may occur.

That the reverse-biasing voltage $V_A$ is appreciably higher than the breakdown voltage $V_B$ causes the avalanche-ionization process, once triggered, to be self-sustaining. Consequently, once triggered, the SPAD is no longer able to detect photons, with the result that, in the absence of appropriate remedies, the SPADs described manage to detect arrival of a first photon, but not arrival of subsequent photons.

In order to be able also to detect these subsequent photons, it is necessary to quench the avalanche current generated within the SPAD, stopping the avalanche-ionization process, and in particular lowering, for a period of time known as "hold-off time", the effective voltage $V_e$ across the junction, so as to inhibit the ionization process and quench the avalanche current, as described hereinafter. Next, the initial conditions of biasing of the junction are restored, in such a way that the SPAD is again able to detect photons. In order to reduce the effective voltage $V_e$ across the junction after absorption of a photon, SPADs may adopt so-called "quenching circuits", either of an active or passive type. In particular, in the case of quenching circuits of a passive type, it is common to use quenching resistors, as described for example in United States Patent Applications Publication Nos.: US2010/0271108 and US2010/0148040, which are incorporated by reference.

As is known, the gain and probability of detecting a photon, i.e., the sensitivity of the SPAD, are directly proportional to the value of the reverse-biasing voltage $V_A$ applied to the SPAD. In fact, the more the reverse-biasing voltage $V_A$ exceeds, in absolute value, the breakdown voltage $V_B$, the higher the probability of occurrence of an avalanche generation of charge carriers, given that it entails a widening of the depleted region and of the electrical field present therein.

However, high reverse biasing voltages $V_A$ are such that, even in the absence of incident photons (a dark condition), a single charge carrier, generated, for example, by transfer of thermal energy, may be sufficient to trigger the avalanche-ionization process, generating a so-called "dark current", which may adversely interfere with normal use of the SPAD.

In particular, the generation of dark current may occur not only in the case where the aforementioned thermally generated carrier is generated within the depleted region, but also in the case where this thermally generated carrier is generated outside the depleted region and manages in any case to diffuse until it reaches the depleted region before recombining. In particular, given the reverse biasing of the junction of the SPAD, in addition to all the carriers generated thermally in the depleted region of the junction, also the minority carriers generated thermally outside the depleted region may contribute to the dark current, these latter minority carriers only in the aforesaid case where they manage to diffuse as far as the depleted region.

In practice, each of the aforementioned thermally generated minority carriers may generate a corresponding output current pulse, to which there does not correspond an effective detection of a photon. Under dark conditions, these output current pulses have a Poisson statistic, and the corresponding statistical mean value is known as "dark count rate" or "dark-noise rate".

From a quantitative standpoint, the performance of a generic SPAD is quantified through the so-called quantum-detection efficiency (QDE), which is defined as the ratio between a first number of photons detected equal to the difference between the mean number of photons detected per unit time and the mean dark noise rate in said unit time, and a second number equal to the mean number of photons that effectively impinge on the SPAD in said unit time.

In greater detail, the quantum-detection efficiency QDE is equal to the product of a photon-absorption efficiency $\eta$ and of an avalanche-triggering probability, the latter being defined as the probability of an electron-hole pair generated in the depletion region effectively triggering a self-sustaining avalanche-ionization process; in particular, this probability is not equal to unity, because there is a non-negligible probability of the carriers of the pair losing energy on account of lattice scattering, thus recombining in such a way that the avalanche-ionization process aborts.

As regards the photon-absorption efficiency $\eta$, to a first approximation (neglecting the contributions of the aforementioned minority carriers) it is given by $$\eta=(1-R)\cdot e^{-\alpha D}\cdot(1-e^{-\alpha W}) \quad (1)$$

where: $\alpha$ is a coefficient of absorption of the photons by the semiconductor that forms the generic SPAD, and is inversely proportional to the wavelength of the photons; R is a power-reflection coefficient of an air-semiconductor interface or else an air-dielectric interface in the case where the photons, before impinging on the junction, impinge on one or more anti-reflection dielectric layers; W is the thickness of the depleted region; and D is the thickness of the non-depleted portion of the region of the junction that is located upstream with respect to the direction of propagation of the photons (in practice, the dead layer, i.e., the portion of semiconductor that the photons traverse before reaching the depleted region).

In order to improve the performance of SPADs, and in particular in order to optimize the signal-to-noise ratio, i.e., the ratio between an effective output current, which derives just from the absorption of photons, and the dark current, it is hence expedient to limit as much as possible the lattice defectiveness of the SPADs themselves. In fact, the main contribution to the dark count rate is given by the so-called phenomenon of Shockley-Read-Hall (SRH) generation through the so-called generation-recombination (G-R) centers, which are located within the forbidden band of the semiconductor material that forms the junction of the SPAD and are caused by lattice imperfections. By reducing the dark count rate, the duration of the so-called quiescence interval, i.e., the mean time interval that elapses between two successive output current pulses (in conditions of dark), increases. Given that, during the quiescence interval, it is possible to detect correctly arrival of the photons, the lower the dark count rate, the higher the probability of absorbing photons and of triggering the avalanche-ionization process, thus improving the overall performance of the SPADs in terms of signal-to-noise ratio. In this connection, given the same dark count rate, the signal-to-noise ratio may, be improved by increasing the quantum-detection efficiency QDE.

Traditionally, the junctions of SPADs of a known type are formed by means of direct ion-implantation processes, which entail the inevitable introduction of lattice imperfections, notwithstanding the execution of subsequent thermal treatments for the annealing of the defects and deactivation of the impurities.

In addition, principally on account of the aforementioned thermal treatments, the SPADs have respective junctions such that the corresponding dead layers have non-negligible thicknesses (up to a few hundreds of nanometers), with consequent decrease in the quantum-detection efficiency QDE, and hence decrease in the signal-to-noise ratio, in particular as regards highly energetic photons (for example, photons in the so-called "blue-near ultraviolet"). Again, the presence of dead layers with non-negligible thicknesses entails non-negligible dark currents, as well as possible deterioration in the performance in terms of response times, on account of the generation of diffusion tails.

Similar considerations may be made for the so-called SPAD arrays, and in particular for the so-called "silicon photomultipliers" (SiPMs), used to improve the performance that may be obtained with individual SPADs.

In detail, an SiPM is a particular SPAD array, formed by an array of SPADs grown on one and the same substrate and provided with respective quenching resistors (for example, of a vertical type) integrated in the SPADs, these quenching resistors being uncoupled and independent of one another. In addition, the anode and cathode contacts of each SPAD are configured so that they may be coupled to a single voltage generator. Consequently, the SPADs of the SiPM may be biased at one and the same reverse-biasing voltage $V_A$; in addition, the avalanche currents generated inside them are multiplexed together so as to generate an output signal of the SiPM equal to the summation of the output signals of the SPADs.

In practice, the SiPM is a device with a wide area and high gain, capable of supplying, on average, an electrical output signal (current) proportional to the number of photons that impinge on the SiPM; however, SiPMs may present the same drawbacks as do the SPADs that compose them.

SUMMARY

An embodiment is a geiger-mode avalanche photodiode and a process for its manufacture that enable the drawbacks of the known art to be at least partially overcome.

BRIEF DESCRIPTION OF THE DRAWINGS

One or more embodiments are now described, purely by way of non-limiting example and with reference to the attached drawings, which may not be drawn to scale, wherein.

DETAILED DESCRIPTION

Figure 1:
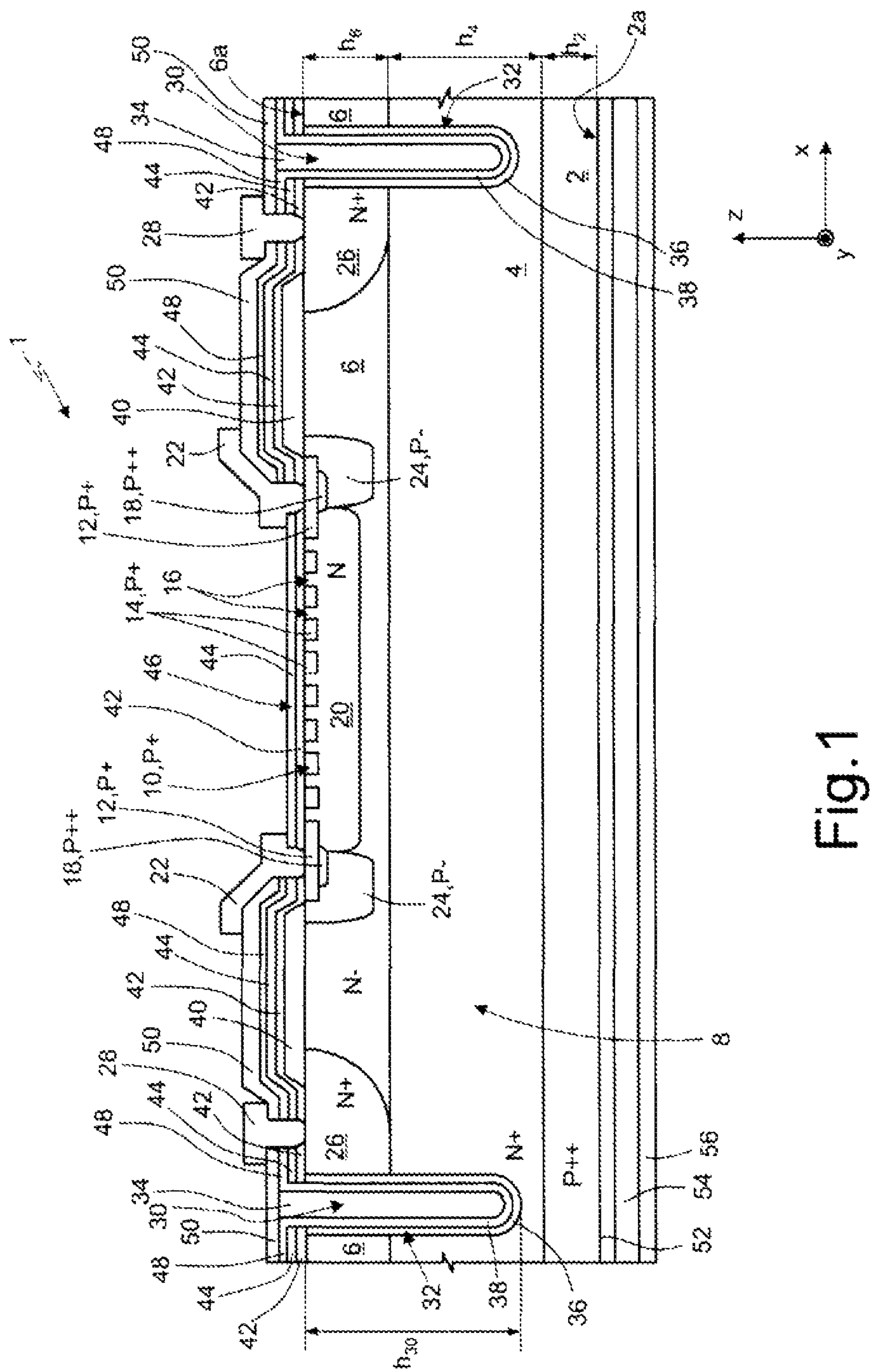
FIG. 1 shows a cross section of one embodiment of an avalanche photodiode.
Figure 2:
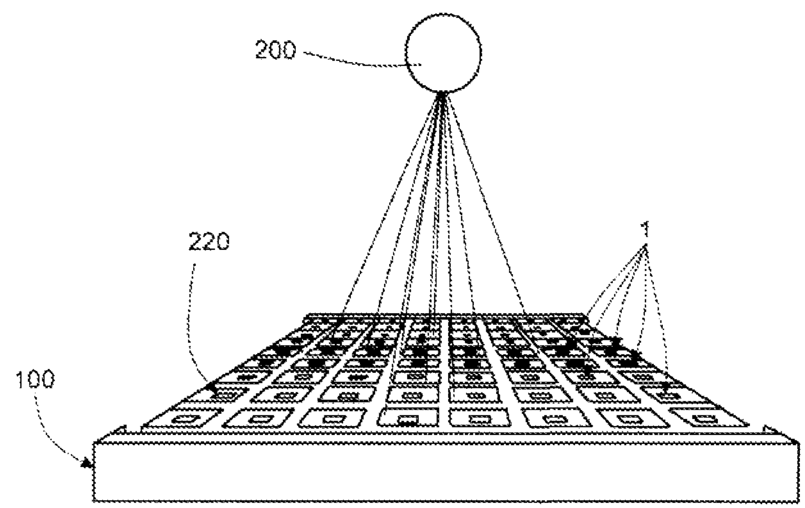
FIG. 2 is a schematic illustration Of an embodiment of an array of photodiodes during use.

FIG. 1 shows an embodiment of a geiger-mode avalanche photodiode 1. The photodiode 1 may belong, for example, to an array 220 of photodiodes 1, as illustrated in FIG. 2, which also shows an external light source 200, which may be constituted, for example, by a scintillator, as described hereinafter. The array 220 may comprise any number of photodiodes 1, according to the application.

Referring to FIG. 1, the photodiode 1 is integrated in a chip 100 (FIG. 2), which includes a substrate 2 made of semiconductor material, of a P++ type (for example doped with boron), having a bottom surface 2*a* and a first thickness $h_2$ ranging, for example, between approximately 300 microns (μm) and 500 μm. In addition, the photodiode 1 includes a first epitaxial layer 4, of an N+ type (for example, doped with phosphorus), having a thickness $h_4$ ranging, for example, between approximately 8 μm and 12 μm, and overlying the substrate 2, in direct contact therewith; and a second epitaxial layer 6, of an N− type, having a top surface 6*a* and a thickness $h_6$ ranging, for example, approximately between 3 μm and 5 μm, and overlying the first epitaxial layer 4, in direct contact therewith.

In greater detail, the substrate 2 may have a respective level of doping in the range between approximately $10^{19}$ $cm^{-3}$ and $10^{20}$ $cm^{-3}$, in such a way as to define a good bottom ohmic contact. The first epitaxial layer 4 may have a respective level of doping in the range between approximately $10^{16}$ $cm^{-3}$ and $5 \cdot 10^{16}$ $cm^{-3}$. The second epitaxial layer 6 may have, instead, a respective level of doping in the range between approximately $1 \cdot 10^{14}$ $cm^{-3}$ and $3 \cdot 10^{14}$ $cm^{-3}$.

The substrate 2, and the first and the second epitaxial layers 4, 6 form, in practice, a body 8 of semiconductor material, comprised between the bottom surface 2*a* and the top surface 6*a*.

A top anode region 10, of a P+ type (for example, doped with boron) and with a level of doping, for example, of approximately $2 \cdot 10^{17}$ $cm^{-3}$, faces the top surface 6*a* and extends within the second epitaxial layer 6.

Figure 3:
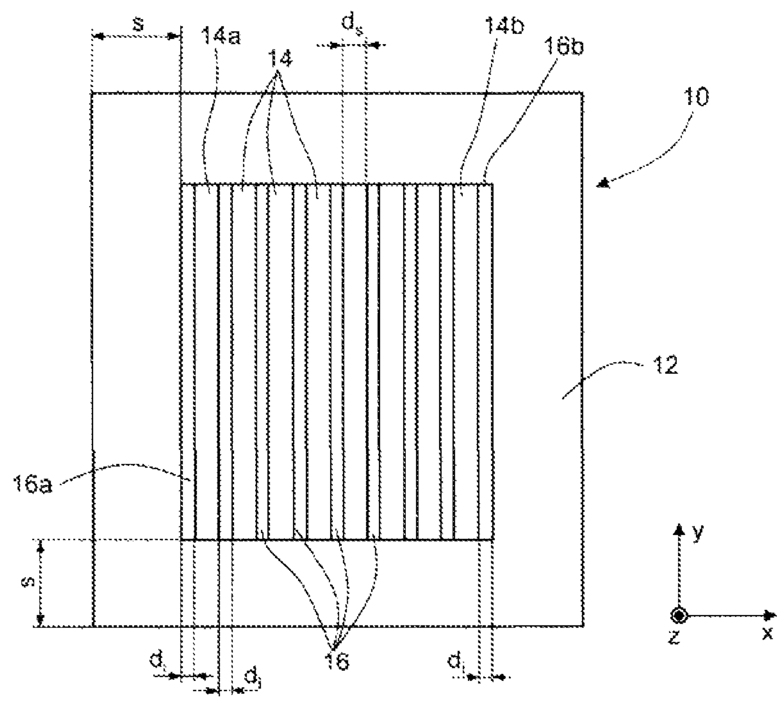
FIG. 3 shows a top plan view of a portion of the photodiode shown in FIG. 1.

As shown in greater detail and by way of example in the plan view of FIG. 3, the top anode region 10 may comprise an external ring 12 with a rectangular shape and a thickness s. The external ring 12 may, in any case, have different shapes, such as, for example, a circular or polygonal shape; in addition, the external ring 12 may not necessarily have a closed shape.

In addition, the top anode region 10 comprises a plurality of strip regions 14 arranged, in top plan view, within the external ring 12, to which they are ohmically coupled. The strip regions 14 and the external ring 12 extend within the second epitaxial layer 6 starting from the top surface 6*a*, with a depth $d_r$ (FIG. 4) that may be between approximately 0.15 μm and 0.3 μm, for example approximately 0.2 μm. Pairs of adjacent strip regions 14 are separated by a respective gap 16, which extends in the second epitaxial layer 6 starting from the top surface 6*a*, with approximately the same depth as the strip regions 14.

As shown by way of example in FIG. 3, the strip regions 14, and, consequently, also the gaps 16, may have a shape, in top plan view, of a rectangle, with the strip regions each having a width of approximately $d_s$ (measured along the axis x of the reference system xyz shown in FIGS. 1 and 2) of, for example, approximately 1 μm. In addition, the strip regions 14 may be the same as one another and parallel to one another; it is likewise possible that present between pairs of adjacent strip regions 14 are gaps 16 that are the same as one another.

By way of example, and with particular reference to an embodiment shown in FIG. 3, it may be possible for all the gaps 16 to have a rectangular shape, in top plan view, and a width of approximately $d_i$ that may be in the range between approximately 2.5 μm and 3.5 μm; for example, the width may be approximately 3 μm. It may be moreover possible to define a first gap 16*a* and a second gap 16*b*, which, strictly speaking, do not separate pairs of adjacent strip regions 14, but rather separate from the external ring 12, respectively, a first strip region 14*a* and a second strip region 14*b*, these first and second strip regions 14*a*, 14*b* being, among all the strip regions 14, the strip regions closest, respectively, to a first side and a second side of the external ring 12, which are opposite to one another and approximately parallel to the strip regions 14 themselves. Also the first and second gaps 16*a*, 16*b* may have a width of approximately $d_i$.

Similar considerations may be made in the case where the external ring 12 has, for example, a circular shape, in top plan view, in which case both the strip regions 14 and the gaps 16 may have the shape, in top plan view, of circular segments with two bases (e.g., two sides not coincident with the perimeter of the circle), whilst the first and second gaps may have the shape of a circular segment with one base (e.g., one side not coincident with the perimeter of the circle). Also in this case, as likewise in the case where, in general, the shape of the top anode region 10 is not regular, it may be, however, possible to define a maximum width $d_{max}$, which indicates the maximum width, in absolute value, among the maximum widths of all the gaps 16 present within the top anode region 10. An enriched anode-contact region 18, of a P++ type (for example doped with boron), extends in the second epitaxial layer 6, underneath, and in direct contact with, the external ring 12 of the top anode region 10. For example, the enriched anode-contact region 18 may have approximately the same shape as the external ring 12 of the top anode region 10, and may have a peak level of doping approximately equal to $5 \cdot 10^{18}$ cm$^{-3}$.

An enriched region 20, of an N type (for example, doped with phosphorus), extends in the second epitaxial layer 6, underneath, and in direct contact with, the top anode region 10. In top plan view, the enriched region 20 has a circular or polygonal shape, for example approximately equal to the shape of the external ring 12 of the top anode region 10, inside which it is comprised (in top plan view). In greater detail, the enriched anode-contact region 18 extends in the second epitaxial layer 6 externally and contiguous to the enriched region 20. In addition, at the gaps 16, the enriched region 20 extends in the second epitaxial layer 6 directly starting from the top surface 6*a*, hence filling the gaps 16 themselves. Again, the enriched region 20 may have a peak level of doping approximately equal to $4 \cdot 10^{15}$ cm$^{-3}$.

For practical purposes, the top anode region 10 and the enriched anode-contact region 18 form an anode region of a first PN junction, which is designed to receive photons and to generate the avalanche current, as described hereinafter. In addition, this anode region is in electrical contact with an anode metallization 22, by means of which it may be possible to bias the first PN junction; in particular, it may be possible to couple the anode metallization 22 to an external junction biasing circuit (not shown), as described hereinafter. By way of clarification, in use, the photons impinge upon the photodiode 1 with a direction opposite to the direction of the unit vector z shown in FIG. 1, in such a way that, with respect to the direction of propagation of the photons, the top surface 6*a* is upstream of the bottom surface 2*a*.

A guard ring 24 of a circular or polygonal shape, of a P− type (for example, doped with boron), extends in the second epitaxial layer 6, externally and contiguous to the enriched region 20. In greater detail, the guard ring 24 in part faces the top surface 6*a*, and in part is set underlying the external ring 12 of the top anode region 10 and the enriched anode-contact region 18, with which it is in direct contact. In addition, the guard ring 24 may have a peak level of doping approximately equal to $7 \cdot 10^{14}$ cm$^{-3}$.

Operatively, the guard ring 24 forms a PN diode with the second epitaxial layer 6 so as to prevent edge breakdown of the anode region of the aforementioned first PN junction.

Outside the guard ring 24, a sinker region 26, of an N+ type (for example doped with phosphorus) and of a circular or polygonal shape, in top plan view, extends in the second epitaxial layer 6 starting from the top surface 6*a*, until it contacts the first epitaxial layer 4. In addition, the sinker region 26 is in direct electrical contact with a cathode metallization 28, which may be set in contact with the aforementioned external junction biasing circuit. Again, the sinker region 26 may have a peak level of doping approximately equal to $3 \cdot 10^{18}$ cm$^{-3}$.

In practice, the first epitaxial layer 4, the second epitaxial layer 6, the enriched region 20, and the sinker region 26 form a cathode region of the aforementioned first PN junction. Consequently, in use, the first PN junction is biased by means of the external junction biasing circuit, which applies between the anode metallization 22 and the cathode metallization 28 a reverse-biasing voltage $V_A$ higher, in absolute value, than the breakdown voltage $V_B$ of the first PN junction, which to a first approximation depends upon the level of doping of the enriched region 20.

Once again with reference to the first PN junction, the top anode region 10 has a sort of patterned geometry thanks to the presence of the strip regions 14 and of the external ring 12. In this way, the first PN junction has a junction interface, i.e., a surface that separates the anode region from the cathode region, with an area of junction greater than the one that may be obtained in the case of planar junction, hence improving the quantum-detection efficiency QDE, in particular in the case of highly energetic photons. In practice, the area of the junction may be greater than the so-called active area of the photodiode 1, i.e., the area within which the photons that impinge upon the photodiode 1 must traverse so that they may be detected. To a first approximation, the active area is defined by the area of the enriched region 20, but for the portions of anode metallization 22, which may extend marginally over external portions of the enriched region 20.

The shapes and arrangements of the external ring 12, of the strip regions 14, and hence of the gaps 16, are moreover such that, when the external junction biasing circuit biases the first PN junction with a voltage at least equal, in absolute value, to the breakdown voltage $V_B$ of the first PN junction, in the first PN junction a depleted region is formed, which, at the gaps 16, faces the top surface 6*a*. In other words, at the breakdown voltage $V_B$, the depleted region extends, starting from the junction interface (and hence, starting from the strip regions 14), within the cathode region with a depth $W_N$ at least equal to half the maximum width $d_{max}$, as shown by way of example in FIG. 4, which refers to the embodiment shown in FIG. 3, for which $d_{max}=d_i$.

Figure 4:
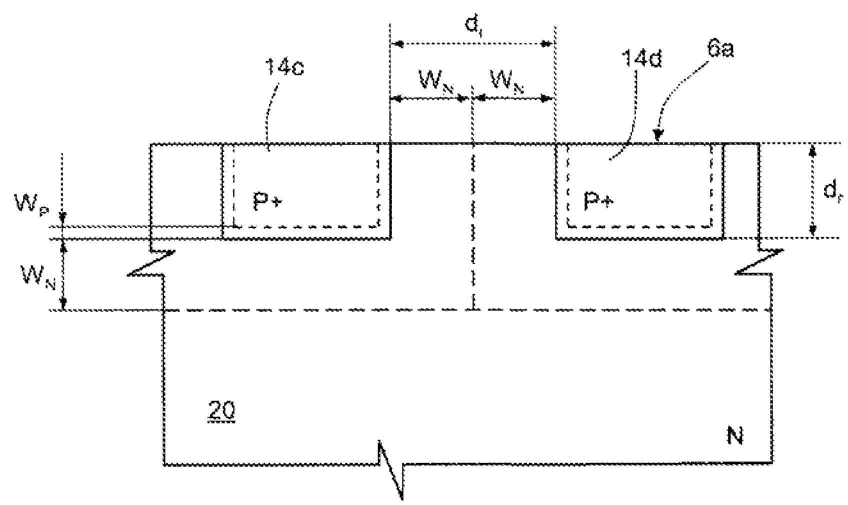
FIG. 4 shows a cross section of a further portion of the photodiode 1 shown in FIG. 1.

By way of example, FIG. 4 shows a first region and a second region adjacent to one another between the strip regions 14, which are designated, respectively, by 14*c* and 14*d*, within which the depleted region extends in the anode region, starting from the junction interface, with a thickness $W_P$. In addition, once again starting from the junction interface, the depleted region extends in the cathode region, and in particular in the enriched region 20, with a thickness $W_N$ at least equal to $d_i/2$.

In other words, for reverse biasing voltages $V_A$ at least equal, in absolute value, to the breakdown voltage $V_B$ of the first PN junction, high signal-to-noise ratios may be obtained, in particular in the case of highly energetic photons, which have a high probability of being absorbed just underneath the top surface 6*a*, and a low probability of being able to penetrate further within the photodiode 1 (for example as far as the first epitaxial layer 4), on account of the high coefficients of absorption $\alpha$. In greater detail, the highly energetic photons have a higher probability of being absorbed in the depleted region of the first PN junction, with consequent increase of the avalanche-triggering probability, and hence of the quantum-detection efficiency QDE. In addition, to a first approximation, the photodiode 1 does not have any dead layer, except for the non-depleted portions of the strip regions 14 and of the external ring 12, which have a depth equal to $d_r-W_P$.

Once again with reference to the first PN junction, the level of doping of the first epitaxial layer 4 performs the function of providing for the avalanche current a low-resistance path between the anode metallization 22 and the cathode metallization 28. A similar function is performed by the sinker region 26, which provides a good ohmic contact with the cathode metallization 28. Likewise, the enriched anode-contact region 18 provides a good ohmic contact between the top anode region 10 of the first PN junction and the anode metallization 22. The second epitaxial layer 6 performs, instead, the function of confining a high electrical field in the proximity of the first PN junction. In addition, the enriched region 20 performs the function of confining a high electrical field in the proximity of the junction interface of the first PN junction.

Again with reference to FIG. 1, the photodiode 1 further comprises a lateral insulation region 30, set externally and possibly contiguous to the sinker region 26 (as in the case of an embodiment shown in FIG. 1). Even though it is not shown, it is in any case possible that extending externally with respect to the lateral insulation region 30 itself is a further sinker region, i.e., that the lateral insulation region 30 extends within an aggregated sinker region; formed by the sinker region 26 and the further sinker region.

In detail, the lateral insulation region 30 has a circular or polygonal shape, in top plan view, and extends vertically in the body 8 to a depth $h_{30}$, measured starting from the top surface 6*a*, for example greater than $h_6$ and of approximately 10 μm. In addition, the lateral insulation region 30 may have a width of approximately 1 μm.

The lateral insulation region 30 comprises a channel-stopper region 32 set more externally, made of dielectric material, for example oxide, and in direct contact with the first and second epitaxial layers 4, 6.

In addition, the lateral insulation 30 region comprises a metal region 34, made for example of tungsten, which fills, and is surrounded by, the channel-stopper region 32, and is moreover in direct contact with a dielectric layer described in detail hereinafter and then referred to as fourth dielectric layer 50, which may have a thickness of approximately 500 nanometers (nm).

The channel-stopper region 32 is formed by a double layer: a thin coating layer 36, for example made of thermal oxide, set more externally, and a thick coating layer 38, for example made of TEOS oxide, set more internally. The thickness of the thin coating layer 36 may be in the range of approximately 15-25 nm, whereas the thickness of the thick coating layer 38 may be in the range of approximately a few hundreds of nanometers (for example, approximately 100-200 nm).

Operatively, the lateral insulation region 30 enables, by means of the metal region 34, optical insulation of the photodiodes 1 of the array 220. In addition, the oxide present in the channel stopper 32 provides electrical insulation between the photodiodes 1 of the array 220.

In other words, the lateral insulation region 30 enables limitation of the negative effects on the photodiode 1 induced by charge carriers generated by adjacent photodiodes and by photons generated by electroluminescence during the process of avalanche multiplication in adjacent photodiodes, these effects being known respectively as "electrical crosstalk" and "optical crosstalk".

On a peripheral region of the top surface 6*a*, laterally staggered with respect to the top anode region 10, and in particular laterally staggered with respect to the external ring 12, a first dielectric layer 40 is present. The first dielectric layer 40 extends partially on top of the guard ring 24 and of the sinker region 26, but not in an area corresponding to the anode metallization 22 and cathode metallization 28.

A second dielectric layer 42, for example made of silicon dioxide $SiO_2$, extends over the top surface 6*a*, on top of the first dielectric layer 40, of the top anode region 10, and of the gaps 16, except for the contact with the anode metallization 22 and with the cathode metallization 28. A coating layer 44 made, for example, of silicon nitride ($Si_3N_4$), extends above the second dielectric layer 42 and forms, together with this, a double anti-reflection coating 46 (DLARC).

By modulating appropriately, in a way in itself known, the thickness of the second dielectric layer 42 and of the coating layer 44, it may be possible to optimize the anti-reflection coating 46, in such a way that it is transparent only for a specific range of wavelengths, and reflecting for the wavelengths falling outside of this range. It may thus be possible to provide photodiodes 1 that are sensitive only to some frequencies of the light spectrum. For example, to optimize absorption of photons with wavelengths close to 420 nm (approximately the boundary between the colors violet and indigo in the electromagnetic spectrum), the second dielectric layer 42 and the coating layer 44 may have thicknesses respectively of, approximately, 140 nm and 60 nm.

A third dielectric layer 48 (for example made of TEOS oxide), which forms a single layer with the thick coating layer 38, and the aforesaid fourth dielectric layer 50 (for example made of TEOS oxide) extend above the coating layer 44, laterally staggered with respect to the top anode region 10, and in particular laterally staggered with respect to the external ring 12, with which there may be partial overlapping, with interposition of portions of the second dielectric layer 42 and of the coating layer 44. However, as has been said previously, present on the sinker region 26 is the cathode metallization 28, which traverses the second, third, and fourth dielectric layers 42, 48, 50, as well as the coating layer 44, and is in direct contact with the sinker region 26.

Likewise, on the metal region 34 of the lateral insulation region 30, which may extend also on the top surface 6*a*, just the fourth dielectric layer 50 is present, which is in direct contact with the metal region 34.

Extending underneath the bottom surface 2*a* and in direct contact therewith is a first bottom metal layer 52, for example made of titanium. A second bottom metal layer 54, made for example of nickel or platinum, extends underneath and in direct contact with the first bottom metal layer 52. A third bottom metal layer 56, made for example of gold, extends underneath and in direct contact with the second bottom metal layer 54. The first, second, and third bottom metal layers 52, 54, 56 form a bottom metallization, and may have thicknesses respectively comprised in the ranges of approximately 50 nm-100 nm, 20 nm-500 nm and 20 nm-50 nm.

Operatively, in addition to the aforementioned first PN junction, the photodiode 1 has a second PN junction, formed by the substrate 2 and by the first epitaxial layer 4. The thicknesses $h_2$ and $h_4$ and the levels of doping of the substrate 2 and of the first epitaxial layer 4 are such that, by biasing, by means of the cathode metallization 28 and the bottom metallization, the second PN junction at a zero or slightly negative voltage (a few volts), the depleted region present in the second PN junction does not extend as far as the second epitaxial layer 6. In addition, also the thickness $h_6$ of the second epitaxial layer 6 may be determined so as to prevent the depleted regions of the first and second PN junctions from overlapping, i.e., so as to maintain the first and second PN junctions uncoupled.

Operatively, biasing the second PN junction at a zero or slightly negative voltage may limit the possibility of carriers, in particular holes, generated in the portion of body 8 underlying the first PN junction, contributing to the avalanche current, and hence to the output signal. In detail, these carriers, alternatively generated thermally or by absorption of photons, may diffuse and reach the depleted region of the first PN junction, where they may trigger an avalanche-ionization process that causes, respectively, an increase in the dark current, or else an increase in the diffusion tails; in the latter case, it may cause a limitation of the rapidity of the photodiode 1 in generating an output current pulse following upon absorption of a photon. In practice, when the second PN junction is biased at a zero or slightly negative voltage, a weak electrical field is created at the interface between the substrate 2 and the first epitaxial layer 4, which attracts the aforementioned holes towards the substrate 2, hence at a distance from the first PN junction, limiting the phenomena described.

Figure 5:
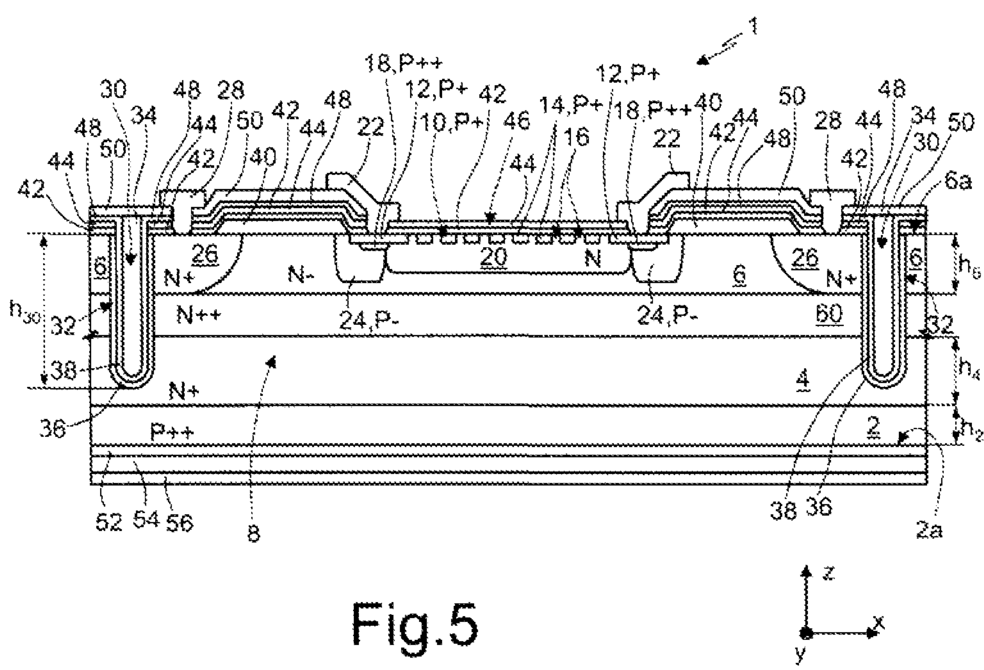
FIGS. 5 and 6 show cross sections of further embodiments of avalanche photodiode.

As shown in FIG. 5, it may likewise be possible for the body 8 to comprise a third epitaxial layer 60, set between the first and second epitaxial layers 4, 6, and having the function of uncoupling the first and second PN junctions. In an embodiment, the first and second epitaxial layers 4, 6 may have reduced thicknesses $h_4$ and $h_6$ with respect to what has been described above as regards FIG. 1.

Figure 6:
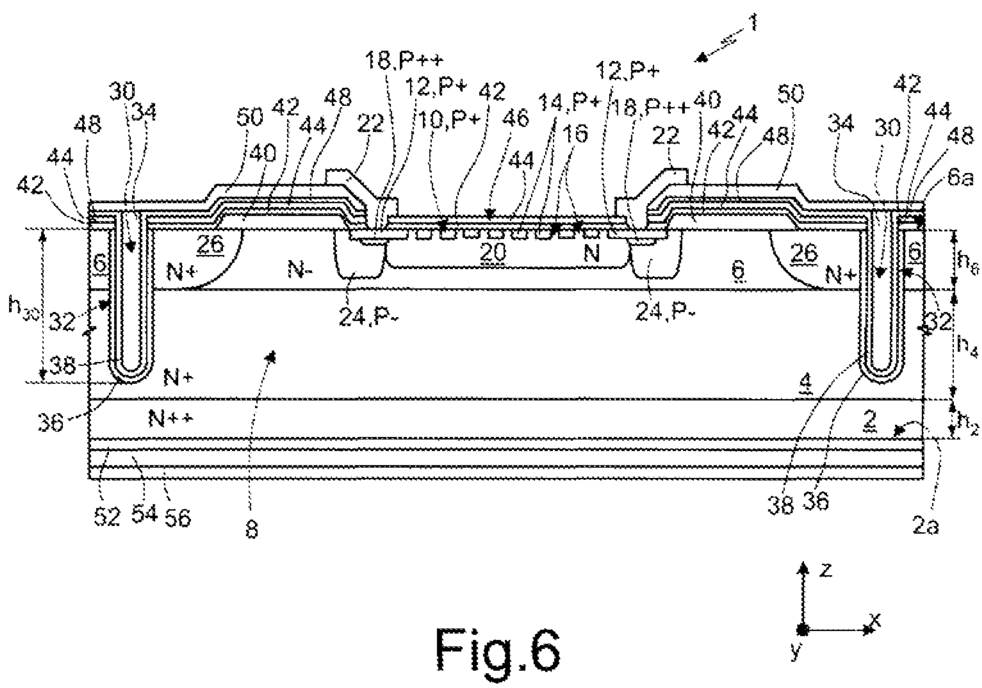

As shown in FIG. 6, it may moreover be possible for the substrate 2 to have the same type of doping as the first and second epitaxial layers 4, 6, for example of an N++ type, as in the embodiment shown in FIG. 1. In this case, the avalanche current may be collected directly at the bottom metallization, so reducing the dimensions of the photodiode 1 in the plane xy. In an embodiment, the cathode metallization 28 may be absent, so as to increase the active area given the same overall dimensions.

An embodiment of the photodiodes 1 described may be produced applying an embodiment of a manufacturing process described in what follows and represented in FIGS. 7-25, which refers, by way of example, to a photodiode embodiment shown in FIG. 1. The process described may, in any case, be used also for the production of other embodiments described above and other embodiments not described above.

Figure 7:
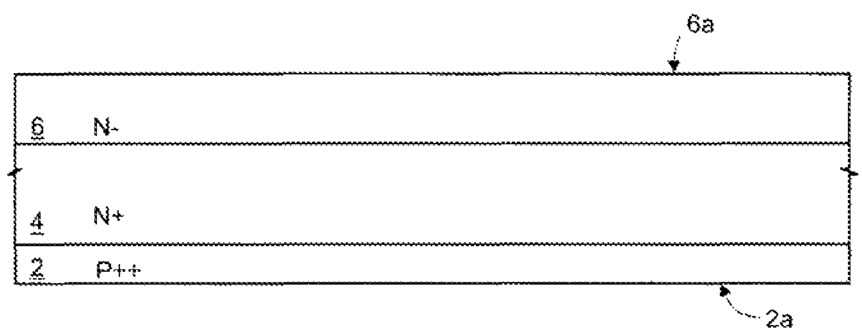
FIGS. 7-25 show cross sections of an embodiment of an avalanche photodiode during successive manufacturing steps.

In greater detail, as shown in FIG. 7, initially grown on the substrate 2 of a P++ type are the first epitaxial layer 4, of an N+ type, and then the second epitaxial layer 6, of an N− type.

Figure 8:
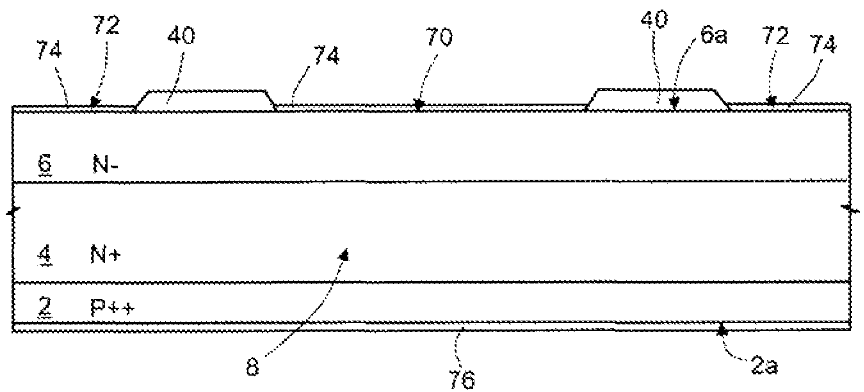

Next, as shown in FIG. 8, a process of thermal oxidation is carried out, which enables formation of the first dielectric layer 40. This process of thermal oxidation is followed by a photolithographic and wet-etching process in order to define the active area, here designated by 70, and portions of top surface 6*a*, here designated by 72, underneath which the sinker region 26 will then be formed. A further process of thermal oxidation and wet etching enables, by means of formation and subsequent removal of a sacrificial oxide layer (not shown), formation of the so-called alignment marks, not shown. In these steps, the use of the wet etching may prevent possible damage to the lattice crystal of the second epitaxial layer 6, and may enable reduction of the introduction of undesirable contaminating particles in the second epitaxial layer 6.

As shown again in FIG. 8, once again by means of thermal oxidation, formed on the top surface 6*a* is a first protective-oxide layer 74, which may have a thickness of approximately 50 nm and has the function of preventing, during the subsequent processes of doping by implantation, metal impurities from contaminating the second epitaxial layer 6. It is noted that, during the process of thermal oxidation, underneath the bottom surface 2*a* a first bottom dielectric layer 76 is formed.

Figure 9:
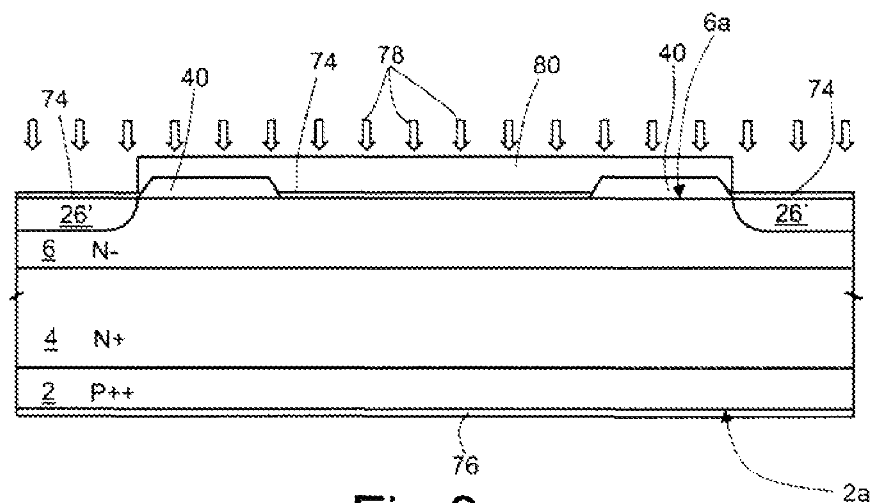
Figure 10:
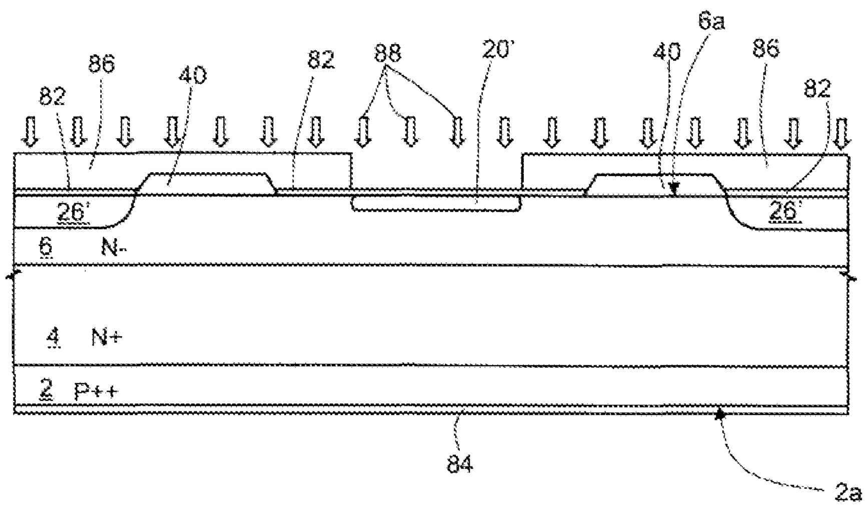
Figure 11:
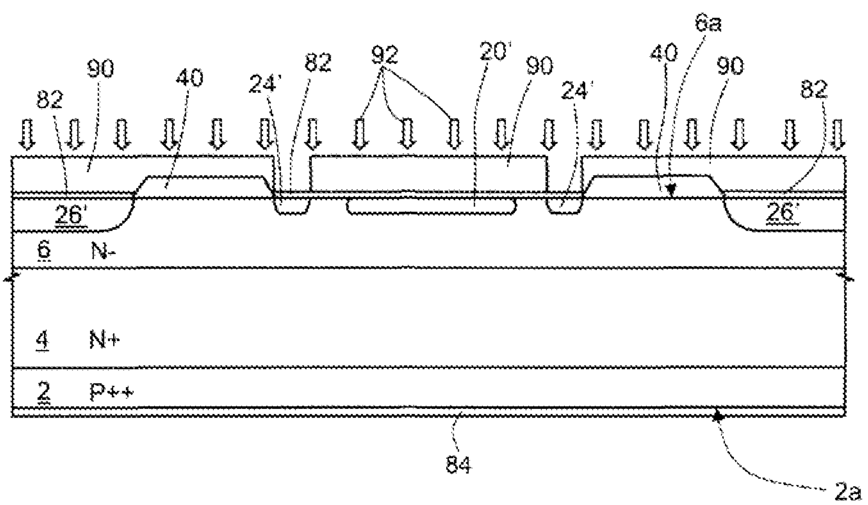

Next, as shown in FIG. 9, by means of a photolithographic process and a subsequent ion implantation of dopant species of an N type, a first thin layer 26' is formed, which extends in the second epitaxial layer 6, underneath the top surface 6*a*, and is designed to form the sinker region 26 once appropriate thermal treatments have been completed, as explained hereinafter. In greater detail, this implantation, indicated by the arrows 78, may occur with high dosage (e.g., approximately $5\cdot10^{14}$-$1\cdot10^{15}$ $cm^{-2}$) and at a high energy (e.g., approximately 100 keV-150 keV), and using a first resist mask 80, for reducing the contamination of sites external to the region in which it is desired to carry out the implantation itself. The first resist mask 80 is then removed once implantation is completed.

Next (FIG. 10), the first protective-oxide layer 74 and the first bottom dielectric layer 76 are removed by means of a wet etch, followed by a subsequent process of thermal oxidation, which enables formation, on the top surface 6*a*, of a second protective-oxide layer 82; at the same time, a second bottom dielectric layer 84 is formed, underneath the bottom surface 2*a*. In particular, the second protective-oxide layer 82 may have a thickness in the range between approximately 15 nm and 25 nm, and performs the function of protecting the top surface 6*a* and the underlying semiconductor material during the next ion-implantation processes. In addition, in order to create the enriched region 20, a further process of ion implantation of dopant species of an N type is carried out at the center of the active area 70, with a low dosage (e.g., approximately $5\cdot10^{11}$-$1\cdot10^{12}$ $cm^{-2}$) and at a low energy (e.g., approximately 40-60 keV), and by means of a second resist mask 86. This process of ion implantation, indicated by the arrows 88, leads to the formation, underneath the top surface 6*a*, of a second thin layer 20'. Once the implantation is completed, also the second resist mask 86 is removed.

Next (FIG. 11), in a peripheral portion of the active area 70, close to the first dielectric layer 40, and externally with respect to the second thin layer 20', a further process of ion implantation of dopant species of a P type is carried out with a low dosage (e.g., approximately $5\cdot10^{11}$-$1\cdot10^{12}$ $cm^{-2}$) and at a low energy (e.g., approximately 40-60 keV), and by means of a third resist mask 90. This process of ion implantation, indicated by the arrows 92, leads to the formation, underneath the top surface 6*a*, of a third thin layer 24', designed to form the guard ring 24. Once the implantation is completed, also the third resist mask 90 is removed.

Figure 12:
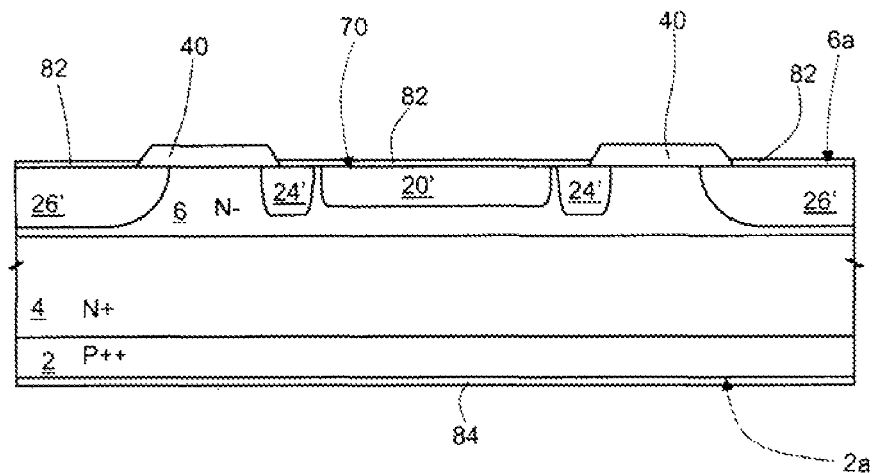
Figure 13:
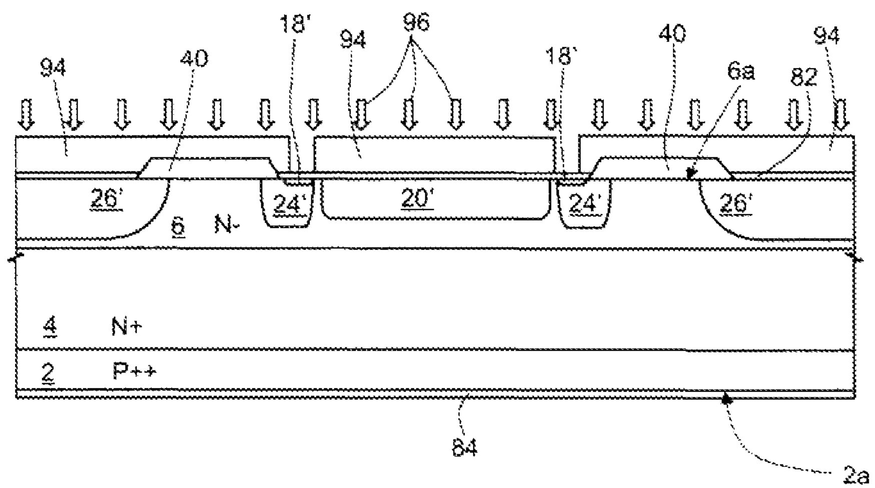
Figure 14:
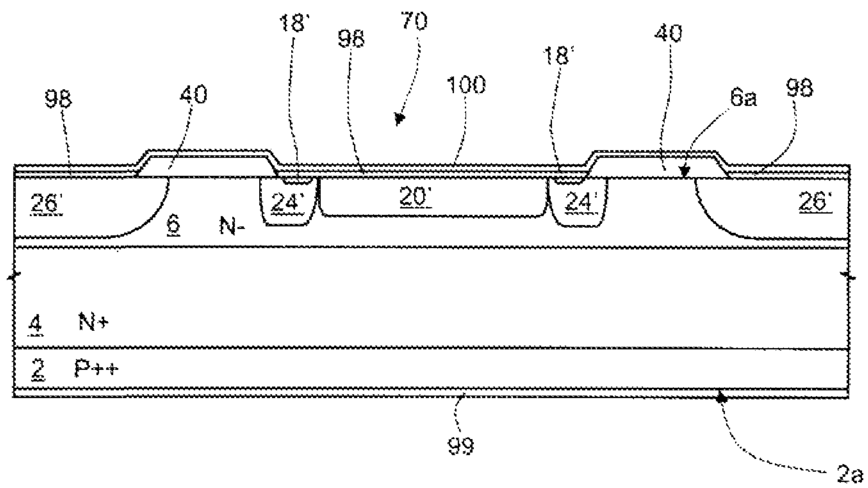

As shown in FIG. 12, then a first thermal annealing is carried out, for activating the electrical impurities previously implanted and for reducing the sites of the second epitaxial layer 6 that have been damaged following upon the previous ion-implantation processes. The first thermal annealing may occur at temperatures close to approximately 1150° C., and for a duration of approximately a few hours, for example approximately three hours. In addition, it involves an increase in the thicknesses of the first, second, and third thin layers 26', 20', 24'.

Next (FIG. 13), using a fourth resist mask 94, a further process of ion implantation with a high dosage (e.g., approximately $1\cdot10^{14}$-$5\cdot10^{14}$ $cm^{-2}$) and at a low energy (e.g., approximately 5-10 keV) of dopant species of a P type is carried out, indicated by the arrows 96. This process of ion implantation leads to formation, underneath the top surface 6*a* and within the third thin layer 24', of a fourth thin layer 18', designed to form the enriched anode-contact region 18. Once the implantation is completed, also the fourth resist mask 94 is removed.

Next (FIG. 14), the second protective-oxide layer 82 is removed from the active area, by means of a wet etch, and on the top surface 6*a* a third protective-oxide layer 98 is formed, having a thickness comprised, for example, between approximately 50 nm and 100 nm. During these operations, the second bottom dielectric layer 84 is removed, and then a third bottom dielectric layer 99 is formed, set underneath the bottom surface 2*a*. The third protective-oxide layer 98 may be obtained by means of a process of growth at a temperature in the range between approximately 750° and 900°, for example approximately 800°, and with a duration, for example, of approximately one hundred minutes. Next, on the photodiode, and in particular on the third protective-oxide layer 98 and the first dielectric layer 40, a polysilicon layer 100 is deposited, doped in situ (i.e., during deposition itself) with dopant species of a P type. The polysilicon layer 100 may have a thickness in the range between approximately 50 nm and 100 nm, and may have a level of doping in the range between approximately $1\cdot10^{20}$ $cm^{-3}$ and $3\cdot10^{20}$ $cm^{-3}$.

Figure 15:
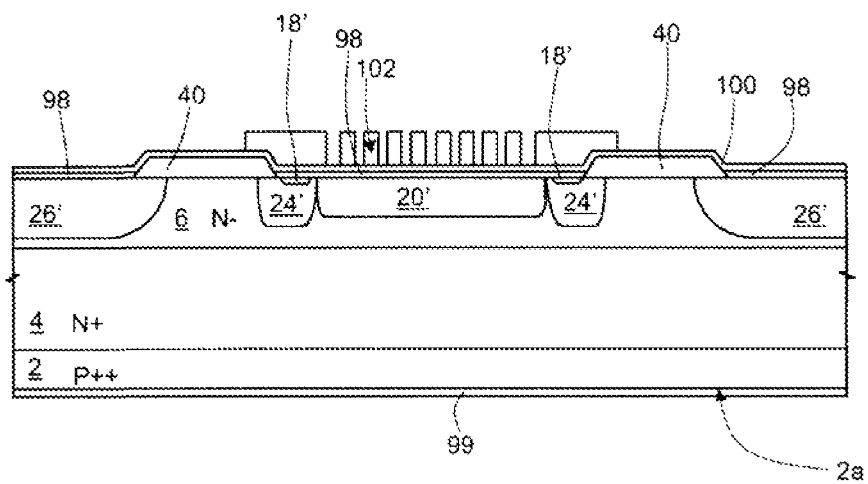

As shown in FIG. 15, by means of a photolithographic process and a subsequent dry-etching process having as end point the third protective-oxide layer 98, the polysilicon layer

Figure 16:
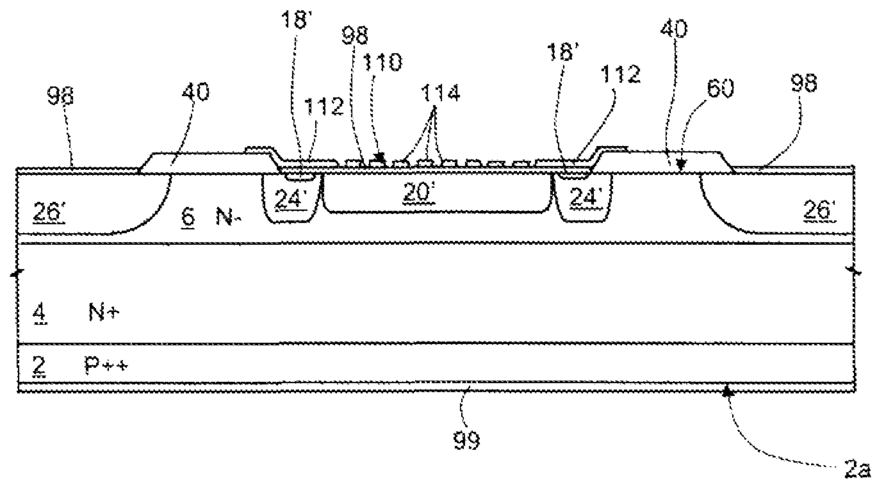

100 is patterned in the portion overlying the active area 70. In practice, during the photolithographic process a fifth resist mask 102 is used, which, in top plan view, has the same shape as the top anode region 10, created subsequently. In this way, as shown in FIG. 16, at the end of the dry-etching process, the polysilicon layer 100 is removed from the photodiode, except within the active area 70, inside which a patterned layer 110 of polysilicon remains. In practice, the patterned layer 110 extends above the top surface 6*a*, with the third protective-oxide layer 98 set in between, and has a shape, in top plan view, that is the same as the shape of the top anode region 10 that is to be created.

With reference, by way of example, to the embodiment shown in FIG. 3, the patterned layer 110 comprises an external patterned portion 112, corresponding to the external ring 12, and a plurality of strip-shaped portions 114, corresponding to the strip regions 14. For example, the strip-shaped portions 114 may have a width of approximately 1 μm, and may be spaced apart by approximately 3 μm.

Figure 17:
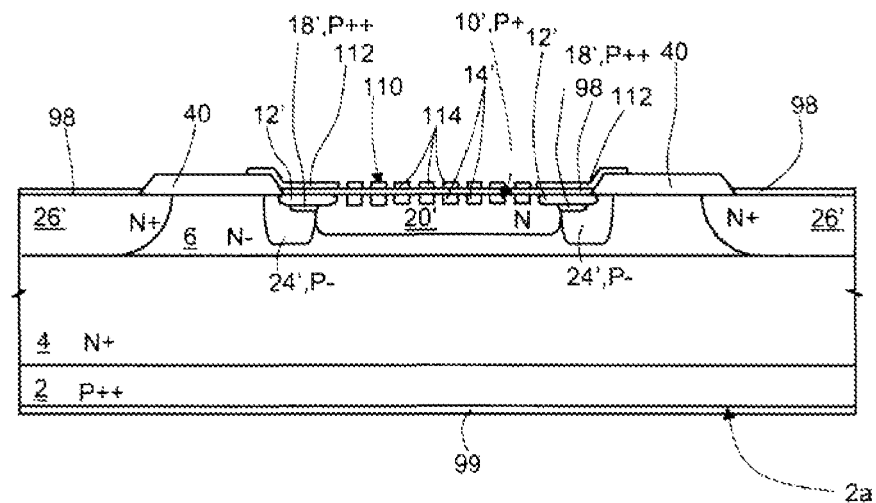

As shown in FIG. 17, a diffusion or "drive-in" process is then carried out, of a duration ranging between approximately five minutes and fifteen minutes, for example approximately ten minutes, and at a temperature in the range between approximately 1100° C. and 1200° C., for example approximately 1150° C. In this way, the dopant species of a P type present in the patterned layer 110 may diffuse, through the third protective-oxide layer 98, underneath the top surface 6*a*, hence in the second epitaxial layer 6 and, in greater detail, within the second thin layer 20', forming a fifth thin layer 10', designed to form the top anode region 10, i.e., the external ring 12 and the strip regions 14. In practice, the fifth thin layer 10' has a shape that, in top plan view, reflects faithfully the shape of the patterned layer 110, and hence comprises a first subregion 12' and a second subregion 14', which are designed to form, respectively, the external ring 12 and the strip regions 14. In addition, thanks to the technique of diffusion through oxide, the fifth thin layer 10', and then, when the process of formation is completed, the top anode region 10, have a depth smaller than the one that may be obtained with direct diffusion in the semiconductor, in particular in the case where, as in the embodiment described, the dopant species present in the patterned layer 110 are of a P type (for example, boron), hence characterized by a high diffusion rate. In addition, the diffusion through oxide enables limitation, as compared to the traditional technique of ion implantation, of the defects that are introduced in the top anode region 10.

During the drive-in process, further processes of diffusion occur, such that the thicknesses of the first, second, third, and fourth thin layers 26', 20', 24' and 18' increase.

Figure 18:
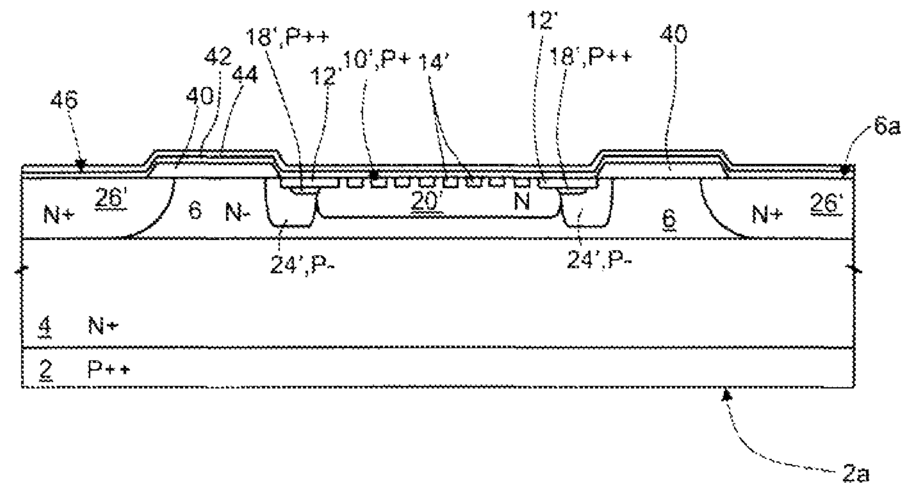

Next, as shown in FIG. 18, the patterned layer 110 is removed, by means of a dry etch with end point on the third protective-oxide layer 98. Then, also the third protective-oxide layer 98 and the third bottom dielectric layer 99 are removed, by means of a timed wet etch. Next, the second dielectric layer 42 and the coating layer 44 are deposited, thus forming the anti-reflection coating 46.

In order to provide the lateral insulation region 30, a trench 120 is then formed (FIG. 19) having the same shape and dimensions as the lateral insulation region 30, which are formed subsequently. In detail, the trench 120 may be provided by means of a photolithographic and dry-etching process, and using a sixth resist mask 122.

Next (FIG. 20), the thin coating layer 36 is grown within the trench 120, for example with a thermal process at approximately 900° C. and with the duration of approximately ten minutes. During this thermal process, the sinker region 26, the enriched region 20, the guard ring 24, the enriched anode-contact region 18, and the top anode region 10 are respectively obtained starting from the first, second, third, fourth, and fifth thin layers 26', 20', 24', 18' and 10', without however this thermal process altering appreciably the thicknesses of the first, second, third, fourth, and fifth thin layers 26', 20', 24', 18' and 10'. A dielectric layer is then deposited, for example by means of a CVD technique, which forms both the third dielectric layer 48 and the thick coating layer 38. In practice, the thin coating layer 36 coats only the internal edges and the bottom of the trench 120, because the thermal oxide cannot grow above the coating layer 44, which is made of silicon nitride ($Si_3N_4$). Consequently, on the top surface 6*a*, in addition to the aforesaid first and second dielectric layers 40, 42, and to the coating layer 44, only the third dielectric layer 48 is added. In addition, during the growth of the thin coating layer 36, underneath the bottom surface 2*a* a fourth bottom dielectric layer 124 is formed.

Figure 21:
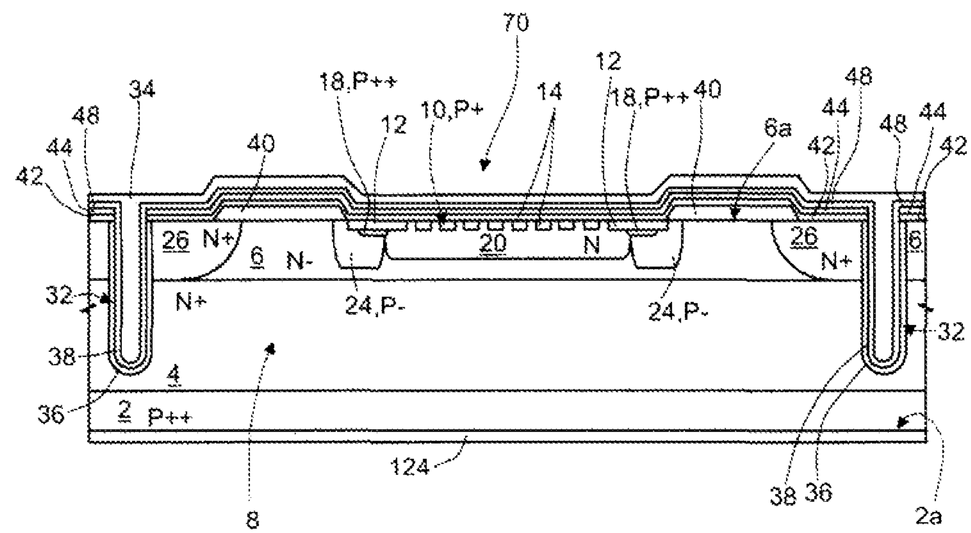

Next, as shown in FIG. 21, the trench 120 is completely filled, via deposition by means of the CVD technique, with metal, for example tungsten, to form the metal region 34.

Figure 22:
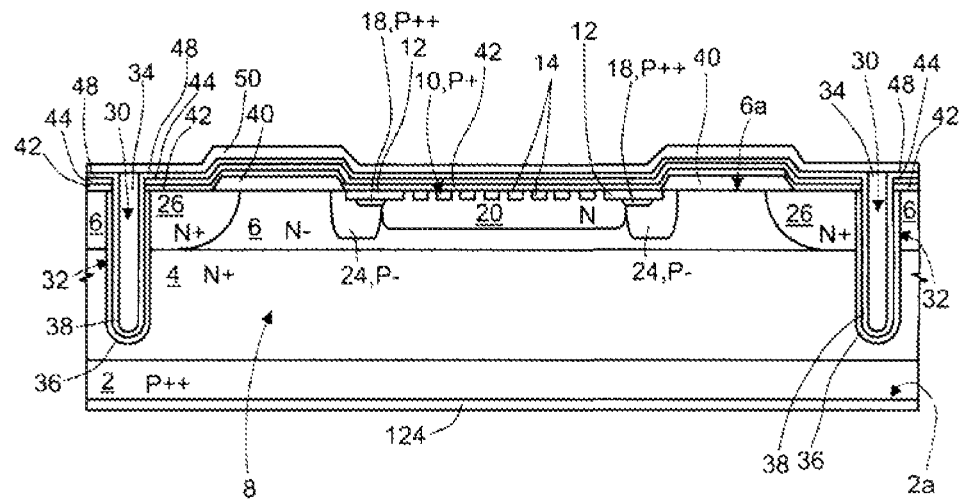

As shown in FIG. 22, after deposition of the metal, an etch is carried out, for example a dry etch, in order to remove the portion of metal deposited on top of the top surface 6*a*. Next, the fourth dielectric layer 50, for example made of TEOS oxide, is deposited so as to insulate the metal region 34 electrically.

Figure 23:
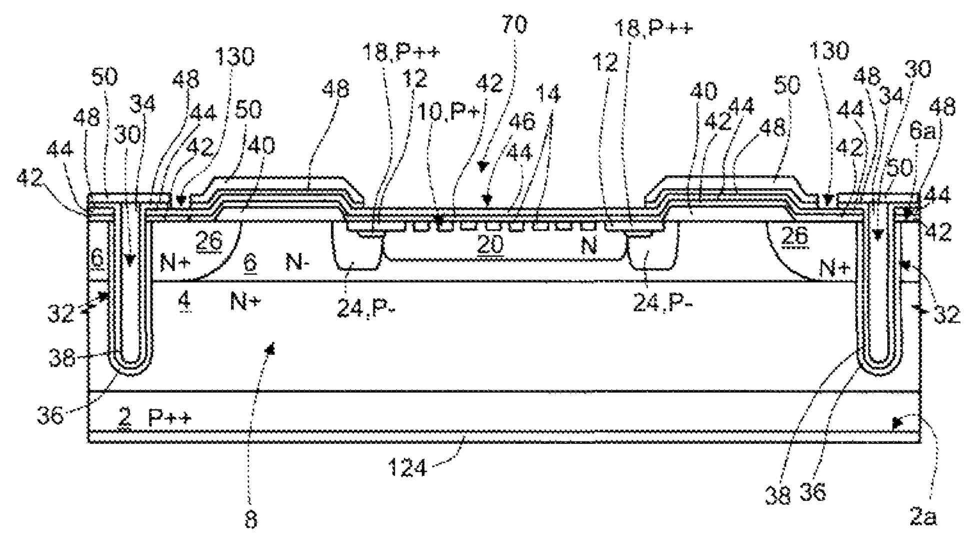

Next, a first window 130 and a second window 132 are formed, in view of formation of the cathode metallization 28 and anode metallization 22. In particular, as shown in FIG. 23, by means of a photolithographic and dry-etching process portions of the third and fourth dielectric layers 48, 50 set above the active area 70 are selectively removed, leaving exposed the region of the double anti-reflection coating 46, which, in use, enables passage of incident photons on the photodiode 1 towards the top anode region 10 and the enriched region 20. In addition, portions of the third and fourth dielectric layers 48, 50 set above the sinker region 26 are removed, i.e., where the first window 130 is to be formed.

Figure 24:
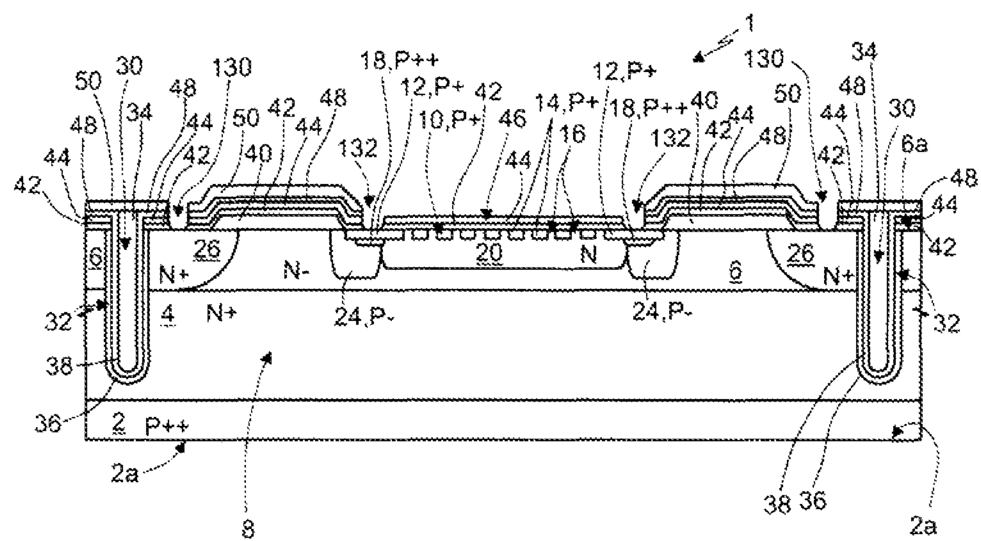
Figure 25:
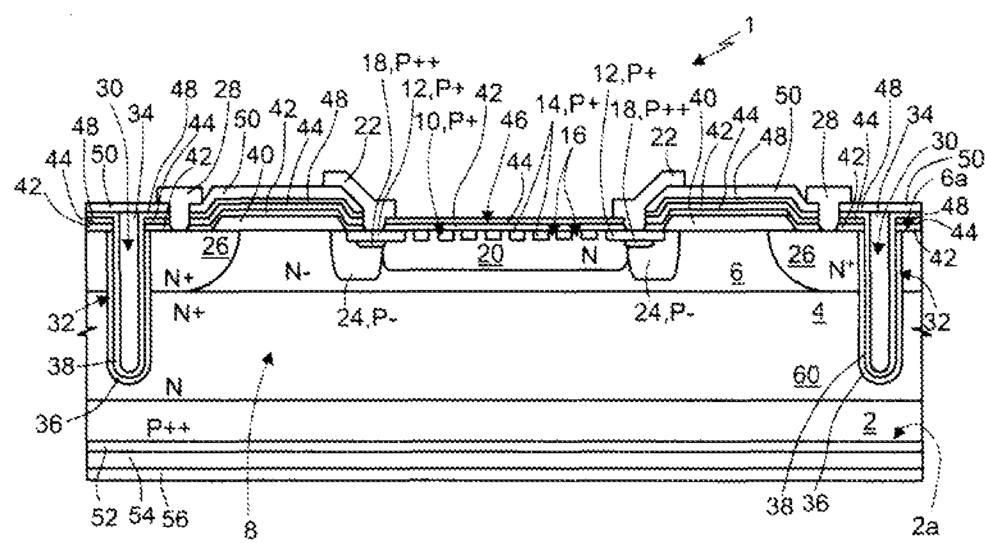

Next, as shown in FIG. 24, a further photolithographic process is carried out, followed by a dry etch with end point on the second dielectric layer 42, for removing the coating layer 44 in an area corresponding to the enriched anode-contact region 18 and the sinker region 26.

Finally, a further wet-etching process is carried out for removing the second dielectric layer 42 in an area corresponding to the enriched anode-contact region 18 and to the sinker region 26, thus forming, respectively, the second and first windows 132, 130.

In this way, in an area corresponding to the first and second windows 130, 132, the top surface 6*a* is exposed, i.e., is not overlaid by any layer from among the coating layer 44, and the first, second, third, and fourth dielectric layers 40, 42, 48, 50. Amongst other things, the wet etch also brings about removal of the fourth bottom dielectric layer 124.

Next (FIG. 25), a step is carried out of deposition by means of the sputtering technique of a top metal layer (not shown), made for example of a ternary alloy of aluminium, silicon and copper, and having a thickness comprised, for example, between approximately 1 μm and 3 μm. A subsequent photolithographic process and process of wet etching of the top metal layer enables formation of the cathode metallization 28 and anode metallization 22, respectively in an area corresponding to the first and second windows 130, 132. Next, on the bottom surface 2*a* of the substrate 2, using the sputtering technique, the first, second, and third bottom metal layers 52, 54, 56 are deposited in succession.

Finally, a process of sintering at a low temperature and in an hydrogen-based environment is carried out in order to passivate possible dangling bonds at the interface between oxide regions and silicon regions, so as to reduce the Schockley-Read-Hall recombination rate.

Figure 26:
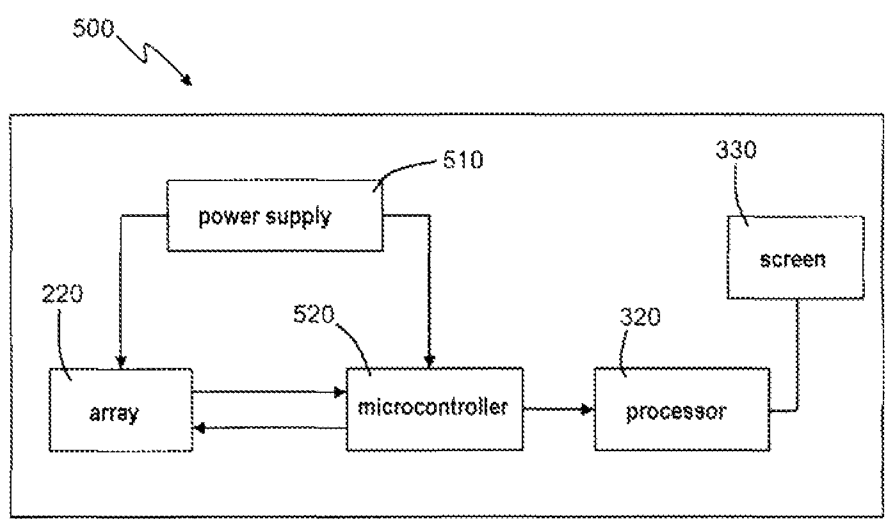
FIG. 26 shows an embodiment of a system that uses an embodiment of an array of photodiodes.

The array 220 of photodiodes 1 may be used in a generic system 500 shown in FIG. 26, in which a power supply 510 supplies at least one array 220 of photodiodes 1 and at least one microcontroller 520 coupled to the array 220. The microcontroller 520 processes the output signal of the array 220 of photodiodes 1, and supplies a processed signal to a processor 320, which enables analysis of the processed signal and display of the information associated with the processed signal on a screen 330.

By way of example, the array 220 of photodiodes 1 may be used in the field of positron-emission tomography (PET), in which gamma rays are detected by using so-called scintillators, such as for example lutelium-orthosilicate (LSO) scintillators or lutelium-yttrium-orthosilicate (LYSO) scintillators. With reference, by way of example, to FIG. 2, the external light source 200 may be formed by one of these LSO or LYSO scintillators, which receive gamma rays and emit, in response to the gamma rays, photons in the blue and in the near ultraviolet. In this way, the photons generated by the scintillators may be effectively detected by the array 220.

Possible advantages that an embodiment of a geiger-mode photodiode affords emerge clearly from the foregoing description. In particular, an embodiment of the photodiode presents simultaneously a low defectiveness and a dead layer with a thickness substantially smaller than that of SPADs of a traditional type.

In greater detail, the substantial absence of the dead layer entails an increase in the quantum-detection efficiency QDE, in particular as regards highly energetic photons, which have higher probability of being absorbed in the proximity of the top surface of the SPAD, and hence within a hypothetical dead layer, with the risk that they do not trigger effectively corresponding avalanche-ionization processes, or else that they trigger them, but with long response times. In addition, the substantial absence of the dead layer reduces the possibility of minority carriers generated therein from contributing to the dark current.

Even though all the types of doping may be reversed with respect to what has been described, embodiments described may be advantageous in the case of highly energetic photons, because the minority carriers that are generated following absorption of photons in the non-depleted portions of the top anode region 10 and that, once they have reached the depletion region, may trigger an avalanche-ionization process, are electrons and not holes. Consequently, given that the electrons, as compared to holes, have a higher impact-ionization rate and a lower recombination rate in the non-depleted portions of the top anode region 10, the avalanche-triggering probability, and hence the quantum-detection efficiency QDE, are particularly high.

In addition, the substantial absence of the dead layer and the presence of the bottom metallization may entail a reduction in the rate of thermal generation of minority carriers in regions set underneath the depleted region of the first PN junction, and hence a reduction in the dark current. In addition, for the same reason, a reduction of the diffusion tails may occur, thus improving the response times of the photodiode.

Finally, it is evident that modifications and variations may be made to an embodiment of a photodiode and to an embodiment of a process described above, without departing from the scope of the present disclosure.

In particular, it may be possible for the photodiode to have a resistive layer, for example made of polysilicon, set between the coating layer 44 and the third dielectric layer 48. The resistive layer may be appropriately doped and patterned, for example by means of a respective photolithographic and etching process, in such a way that it performs the electrical function of quenching resistor. Instead of the polysilicon, it likewise may be possible to use another material provided with an appropriate conductivity and an energy bandgap that is wider than that of the semiconductor that forms the body of the photodiode.

Figure 19:
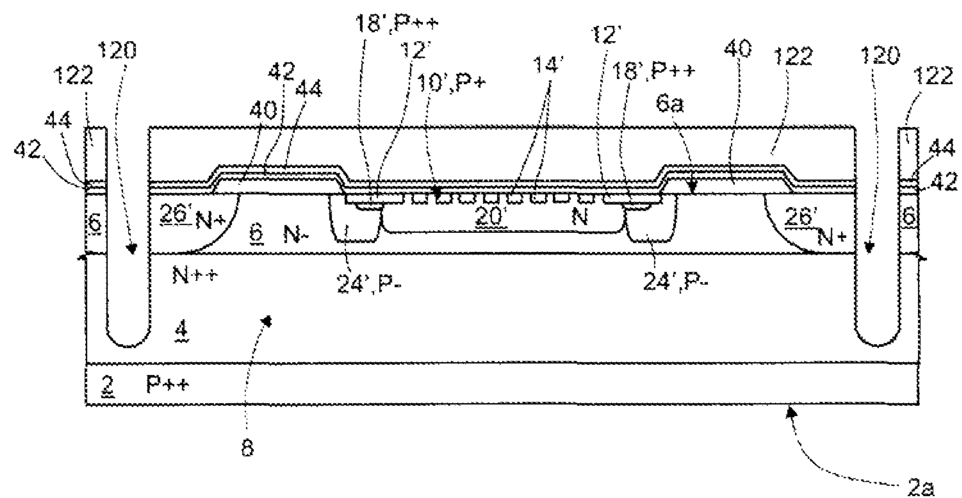
Figure 20:
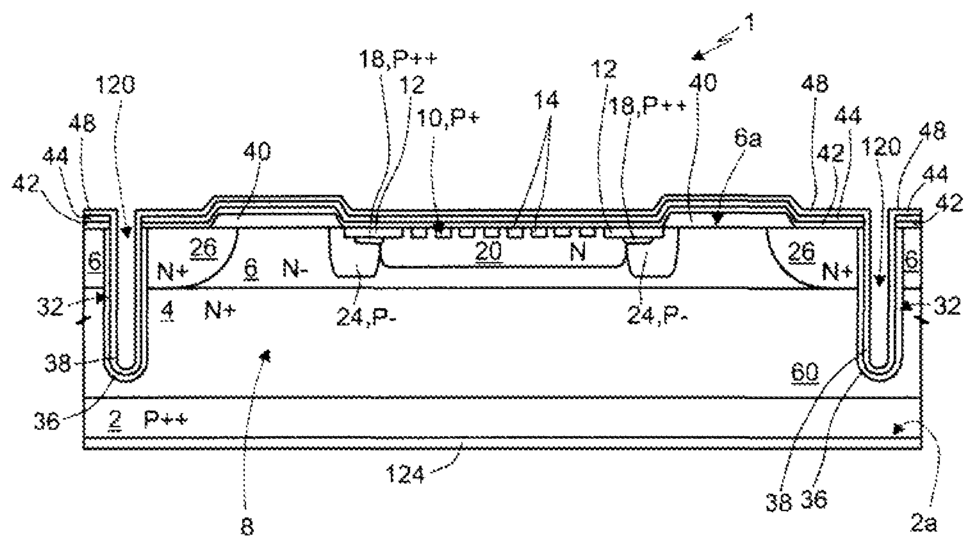

By way of example, the aforementioned resistive layer may be deposited, and subsequently patterned, between the steps described and shown respectively in FIGS. 18 and 19. In addition, in this case, the thermal budget used during the step of growth of the thin coating layer 36 may enable, simultaneously, activation of the impurities present in the resistive layer.

It moreover may be possible for the body 8, the anode region (top anode region 10 and enriched anode-contact region 18), the guard ring 24, and the enriched region 20 to be of an opposite type with respect to the one described.

Moreover possible may be embodiments without the second epitaxial layer 6 and/or the guard ring 24.

In addition, embodiments may be possible without the enriched region 20 and/or the lateral insulation region 30. Again, the channel-stopper region 32 may be formed by a single layer of insulating material.

Finally, instead of the strip regions 14, the top anode region 10 may comprise regions or isles of a different shape.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor device comprising:

a first layer of semiconductor material having a first conductivity type;

a first region being in the first layer and having the first conductivity type;

a second region being in the first region, having a second conductivity type, said second region having a plurality of fingers extending across said first region and being separated from one another by portions of the first region, and a ring being integral with and surrounding the plurality of fingers, said plurality of fingers defining a diode junction with said first region, the portions of the first region having a width less than or equal to twice a depletion region depth of the diode junction;

a third region being in the first layer below the ring of the second region, having the second conductivity type, and having a dopant concentration greater than a dopant concentration of the ring of the second region;

an anode contact layer contacting said ring; and a cathode contact layer laterally spaced apart from said first and second regions.

2. The semiconductor device of claim 1 wherein the first layer of semiconductor material comprises an epitaxial layer.

3. The semiconductor device of claim 1 wherein the first layer of semiconductor material has a surface; and wherein the plurality of fingers of the second region is at the surface of the first layer.

4. The semiconductor device of claim 1 wherein the second region comprises a border; and wherein the plurality of fingers of the second region join the border.

5. The semiconductor device of claim 1 wherein the second region comprises a border that is only partially in the first region.

6. The semiconductor device of claim 1 further comprising a guard region in the first semiconductor layer adjacent to the first region and having the second conductivity type.

7. The semiconductor device of claim 1 further comprising a fourth region in the first semiconductor layer adjacent to the first region and having the first conductivity type.

8. The semiconductor device of claim 1 further comprising an insulating region in the first layer adjacent to the first region and including an electrical insulator and an optical insulator in the electrical insulator.

9. The semiconductor device of claim 1 further comprising a second layer of semiconductor material below the first layer and having the first conductivity type.

10. The semiconductor device of claim 1 further comprising a second layer of semiconductor material below the first layer and having the second conductivity type.

11. A semiconductor device comprising:

a first layer of semiconductor material having a first conductivity type;

a first region being in the first layer and having the first conductivity type;

a second region being in the first region, having a second conductivity type, said second region having a plurality of fingers extending across said first region and being separated from one another by portions of the first region, and a ring being integral with and surrounding the plurality of fingers, said plurality of fingers defining a diode junction with said first region, the portions of the first region having a width less than or equal to twice a depletion region depth of the diode junction;

a third region being in the first layer below the ring of the second region, having the second conductivity type, and having a dopant concentration greater than a dopant concentration of the ring of the second region;

an anode contact layer contacting said ring;

a cathode contact layer laterally spaced apart from said first and second regions; and an enriched anode region below said anode contact layer and surrounding said first and second regions.

12. The semiconductor device of claim 11 wherein the first layer of semiconductor material comprises an epitaxial layer.

13. The semiconductor device of claim 11 wherein the first layer of semiconductor material has a surface; and wherein the plurality of fingers of the second region is at the surface of the first layer.

14. The semiconductor device of claim 11 wherein the second region comprises a border; and wherein the plurality of fingers of the second region join the border.

15. The semiconductor device of claim 11 wherein the second region comprises a border that is only partially in the first region.

16. The semiconductor device of claim 11 further comprising a guard region in the first semiconductor layer adjacent to the first region and having the second conductivity type.

17. The semiconductor device of claim 11 further comprising a fourth region in the first semiconductor layer adjacent to the first region and having the first conductivity type.

18. The semiconductor device of claim 11 further comprising an insulating region in the first layer adjacent to the first region and including an electrical insulator and an optical insulator in the electrical insulator.

19. The semiconductor device of claim 11 further comprising a second layer of semiconductor material below the first layer and having the first conductivity type.

20. The semiconductor device of claim 11 further comprising a second layer of semiconductor material below the first layer and having the second conductivity type.

21. An integrated circuit (IC) comprising:

a plurality of semiconductor devices, each semiconductor device comprising a first layer of semiconductor material having a first conductivity type, a first region being in the first layer and having the first conductivity type, a second region being in the first region, having a second conductivity type, said second region having a plurality of fingers extending across said first region and being separated from one another by portions of the first region, and a ring being integral with and surrounding the plurality of fingers, said plurality of fingers defining a diode junction with said first region, the portions of the first region having a width less than or equal to twice a depletion region depth of the diode junction, a third region being in the first layer below the ring of the second region, having the second conductivity type, and having a dopant concentration greater than a dopant concentration of the ring of the second region, an anode contact layer contacting said ring, and a cathode contact layer laterally spaced apart from said first and second regions.

22. The IC of claim 21 wherein the first layer of semiconductor material comprises an epitaxial layer.

23. The IC of claim 21 wherein the first layer of semiconductor material has a surface; and wherein the plurality of fingers of the second region is at the surface of the first layer.

24. The IC of claim 21 wherein the second region comprises a border; and wherein the plurality of fingers of the second region join the border.

25. The IC of claim 21 wherein the second region comprises a border that is only partially in the first region.

26. The IC of claim 21 wherein each semiconductor device further comprises a guard region in the first semiconductor layer adjacent to the first region and having the second conductivity type.

27. The IC of claim 21 wherein each semiconductor device further comprises a fourth region in the first semiconductor layer adjacent to the first region and having the first conductivity type.

28. The IC of claim 21 wherein each semiconductor device further comprises an insulating region in the first layer adjacent to the first region and including an electrical insulator and an optical insulator in the electrical insulator.

29. The IC of claim 21 wherein each semiconductor device further comprises a second layer of semiconductor material below the first layer and having the first conductivity type.

30. The IC of claim 21 wherein each semiconductor device further comprises a second layer of semiconductor material below the first layer and having the second conductivity type.

* * * * *